(12) United States Patent
Hosono et al.

(10) Patent No.: US 6,704,223 B2
(45) Date of Patent: *Mar. 9, 2004

(54) NON-VOLATILE SEMICONDUCTOR MEMORY

(75) Inventors: Koji Hosono, Yokohama (JP); Toshihiko Himeno, Yokohama (JP); Kenichi Imamiya, Ota-Ku (JP); Hiroshi Nakamura, Fujisawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/241,468

(22) Filed: Sep. 12, 2002

(65) Prior Publication Data

US 2003/0007385 A1 Jan. 9, 2003

Related U.S. Application Data

(63) Continuation of application No. 09/731,910, filed on Dec. 8, 2000, now Pat. No. 6,462,985.

(30) Foreign Application Priority Data

Dec. 10, 1999 (JP) ............................................ 11-351396
Oct. 30, 2000 (JP) ....................................... 2000-330971

(51) Int. Cl.[7] .............................................. G11C 16/06
(52) U.S. Cl. ............................ 365/185.09; 365/185.11; 365/185.17; 365/185.28; 365/185.29
(58) Field of Search ..................... 365/185.09, 185.11, 365/185.17, 185.28, 185.29, 185.01

(56) References Cited

U.S. PATENT DOCUMENTS

| 4,451,903 A | 5/1984 | Jordan et al. |
| 5,508,543 A | 4/1996 | Hartstein et al. |
| 5,523,974 A | 6/1996 | Hirano et al. |
| 6,052,313 A | 4/2000 | Atsumi et al. |

FOREIGN PATENT DOCUMENTS

| JP | 08-044628 | 2/1996 |
| JP | 2000-112826 | 4/2000 |

*Primary Examiner*—Hoai Ho
(74) *Attorney, Agent, or Firm*—Banner & Witcoff, Ltd.

(57) ABSTRACT

A non-volatile semiconductor memory includes a memory cell array having a plurality of electrically-rewritable non-volatile memory cells. The memory cell array is provided with an initially-setting data area, programmed in which is initially-setting data for deciding memory operation requirements. The non-volatile semiconductor memory also includes an initial-set data latch. The initially-setting data of the memory cell array is read out and transferred to the data latch in an initially-setting operation.

34 Claims, 21 Drawing Sheets

NON-VOLATILE SEMICONDUCTOR MEMORY

CROSS REFERENCE TO RELATED APPLICATIONS

This application is a continuation of prior U.S. patent application Ser. No. 09/731,910, filed Dec. 8, 2000, now U.S. Pat. No. 6,462,985 which claims benefit of priority under 35 U.S.C. §119 to Japanese Patent Application No. 1999-351396 filed on Dec. 10, 1999 in Japan and also Japanese Patent Application No 2000-330971 filed on Oct. 30, 2000 in Japan, the entire contents of which are incorporated by reference herein.

BACKGROUND OF THE INVENTION

The present invention relates to a non-volatile memory.

Large-scale integrated semiconductor memories are provided with redundant circuitry for remedying defectiveness. The same is applied to electrically-erasable (rewritable) non-volatile memories (EEPROM).

Well-known redundant circuitry has redundant raw and column cell arrays to a memory cell array and a fuse circuit for storing addresses at which defective memory cells are located (called defective addresses hereinafter). Such a fuse circuit mostly consists of laser-brown type fuses.

Defective addresses for defective cells detected in a wafer test are programmed onto a fuse circuit. Once the fuse circuit has been programmed, an input detective address is compared with the defective addresses stored in the fuse circuit. If they are met, a replacement control is performed such that a decoder is controlled to select a redundant cell in place of the defective cell.

In addition to storing address data for a remedy for defectiveness as described above, the fuse circuit stores several initially-setting data for deciding memory operation requirements. The initially-setting data includes adjustment data to chip internal voltages that vary among chips or wafers, setting data for data-programming voltage, control parameters for the number of loops for programming (writing) and erasing, and so on.

The fuse circuit, however, cannot be reprogrammed. Moreover, defective cell detection by a tester in a wafer test and laser-fuse blowing are different processes so that they cannot be performed as a sequential process.

In place of such a fuse circuit, an electrically-erasable non-volatile memory cell the same as a memory cell for an EEPROM has been proposed as an initially-setting data storing circuit because such a non-volatile memory cell can easily program data compared to a fuse blowing and is data-rewritable.

However, proposed so far is a system in which a non-volatile memory cell array for storing initially-setting data is provided separately from a data-storing memory cell array. Such a system thus requires circuitry specially for reading data from, programming data to and erasing data in a memory cell array for storing initially-setting data other than that for a data-storing memory cell array. This results in complex circuitry, increase in chip area and also complex control for data verification and reprogramming, etc.

SUMMARY OF THE INVENTION

A purpose of the present invention is to provide a non-volatile memory cell capable of storing initially-setting data with easy data verification and reprogramming.

The present invention provides a non-volatile semiconductor memory including; a memory cell array having a plurality of electrically-rewritable non-volatile memory cells, provided with an initially-setting data area, written in which is initially-setting data for deciding memory operation requirements; a first decoder that selects memory cells in the memory cell array according to address signals; a sense-amplifier that detects and amplifies data stored in at least a memory cell selected by the first decoder; a latch circuit having a plurality of initially-setting data latches that latches the initially-setting data: and a controller that reads out the initially-setting data via the first decoder and the sense-amplifier and transfers the initially-setting data to the latch circuit.

According to the invention, initially-setting data is written (programmed) in an initially-setting data area of a memory cell array. The initially-setting data can be read out by a decoder and a sense-amplifier, like in usual data reading.

A controller used for writing (programming) and erasing control is preprogrammed so as to automatically execute an initially-setting operation to read out initially-setting data written in the initially-setting data area of a memory cell and transfer the data to an initially-setting data latch after power is on.

Accordingly, the present invention does not require any special circuitry for storing initially-setting data in an area apart from the memory cell array.

The decoder and the sense-amplifier can be shared by both usual data reading and initially-setting data reading, thus the present invention achieves simple circuitry on a small chip area.

The present invention also offers easy verification and updating of initially-setting data.

DETAILED DESCRIPTION OF THE PREFERRED EMBODIMENTS

Figure 1:
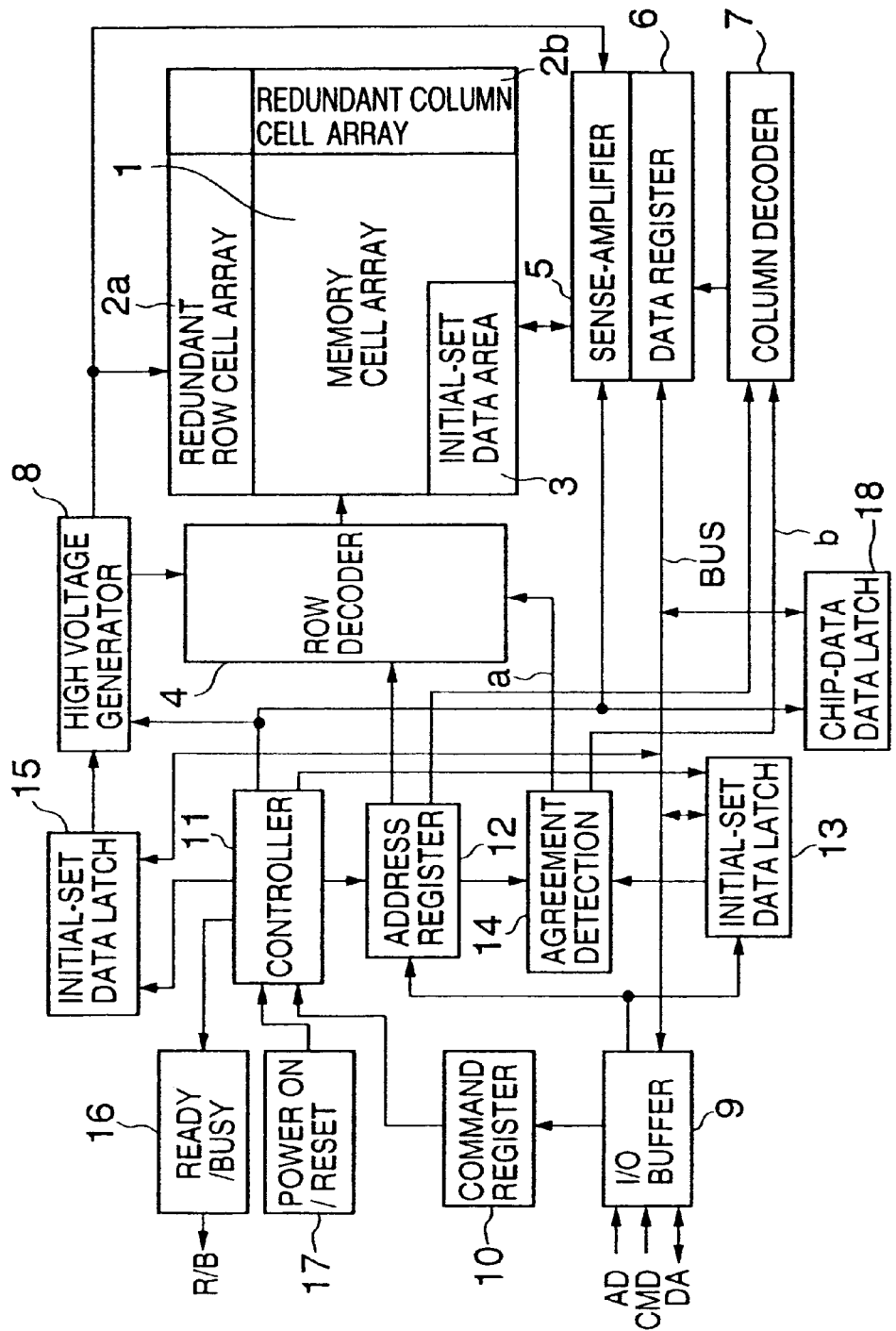
FIG. 1 is a block diagram of an EEPROM as the first preferred embodiment according to the present invention.

Preferred embodiments according to the present invention will be disclosed with reference to the attached drawings.
The First Embodiment FIG. 1 is a block diagram of an EEPROM as the first preferred embodiment according to the present invention.

A memory cell array 1 has a plurality of electrically-rewritable non-volatile memory cells arranged in a matrix. Each memory cell includes a stacked-gate type MOS transistor in which a floating gate and a control gate are stacked. The memory cell array 1 also has a redundant row cell array 2a and a redundant column cell array 2b for replacing detective cells. Provided in the memory cell array 1 is an initial-set data area 3 for programming (writing) initially-setting data for deciding memory operation requirements.

Figure 2:
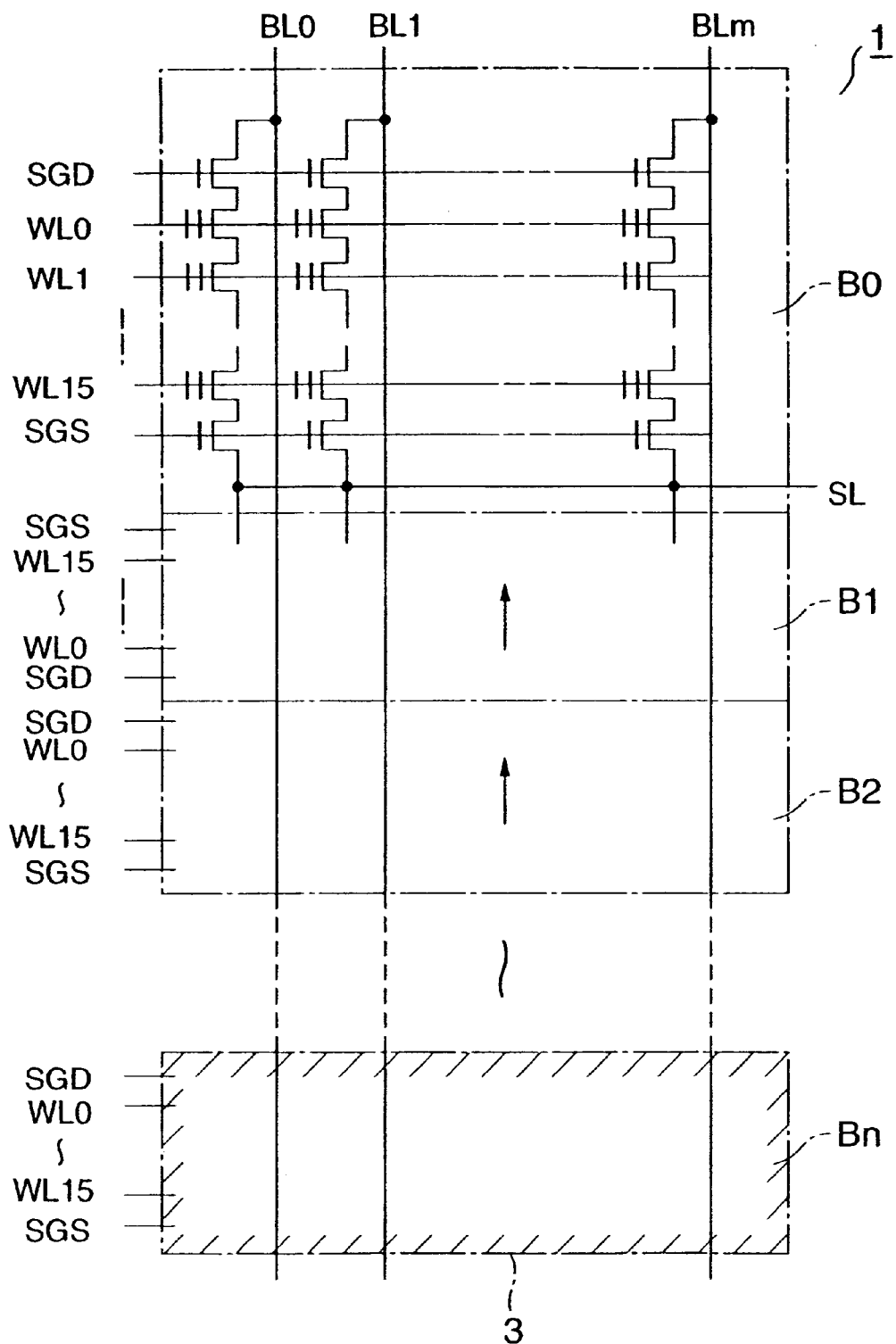
FIG. 2 is a circuit diagram of a memory cell array included in the first embodiment.

FIG. 2 is a circuit diagram of the memory cell array 1. Shown here are NAND-cell units each containing series-connected 16 memory cells. The NAND-cell units to which common word lines WL are connected constitute a cell block that is the minimum unit for data erasing. Arranged here are cell blocks B0, B1, . . . , and Bn to which common bit lines BL0, BL1, . . . and BLm are connected. In this arrangement, for example, the cell block Bn indicated by a dot line is set as the initial-set data area 3.

The initial-set data area 3 can be selected and driven through bit and word lines BL and WL for data programming, erasing and reading, however, is inaccessible from the outside in a regular EEPROM-operation, as discussed later. The initial-set data area 3 is thus not erased while all data or block data are erased.

The minimum unit of the initial-set data area 3 is a NAND-cell block that is the minimum unit for erasing for a NAND-type EEPROM. This is the same structure as for the data memory calls of the array 1. Layout and circuit operation are the same as a usual NAND-cell block; hence designing for the initial-set data area 3 is easy. The initial-set data area 3 may have a cell-block structure with word lines fewer than a usual NAND-cell block for a short data length to be stored in the initial-set data area 3, which offers an area smaller than an initial-sat data area having the same area for each data memory cell block of the array 1.

In FIG. 1, the bit lines BL are connected to a data register 6 via a sense-amplifier 5. A row decoder 4 is used for selecting word lines WL of the memory cell array 1. For a NAND-type flash memory, a data size transferred between the call array 1 and the data register 6 equals 512 bytes that is a page size. In detail, the NAND-type flash memory is provided with a sense-amplifier and a data register corresponding to the page size. In reading, data in the memory call connected to a selected word line WL, that is, one-page data is simultaneously read out to the sense-amplifier and a data register via the bit lines. In programming, one-page data is transferred from the data register 6 and programmed into memory cells via the bit lines. Data transfer is performed between the data register 6 and the data bus BUS at column addresses selected by the column decoder 7.

An address AD, data DA and a command CMD are input to an I/O buffer 9 and then transferred to an address register 12, a data register 6 and a command register 10, respectively.

Row and column addresses generated by the address register 12 are decoded by the row decoder 4 and the column decoder 7, respectively, for memory cell selection.

Several high voltages for date programming and erasing are generated by a voltage booster of a high voltage generator 8.

The command CMD is transferred to the command register 10, and based on this command, the controller 11 performs, for example, reading, programming and erasing control.

In detail, performed in data programming are a verification operation to verify a programming operation to a selected memory cell and programmed data, and a reprogramming operation to a memory cell to which data has been insufficiently programmed. Moreover, performed in data erasing are a verification operation to verify an erasing operation to a selected memory cell and erased data, and a re-erasing operation to a memory cell from which data has been insufficiently erased. These operations are controlled by the controller 11 according to programming and erasing modes.

The initially-setting data to be programmed in the initial-set data area 3 are defective address data, several control data for data programming and erasing (voltage data, the number of loops for programming and erasing, etc) and chip data (ID-code), such as, code for memory storage capacity and specifications, and a maker-code, which have been revealed in a wafer test. Such initially-setting data is programmed in the initial-set data area 3 by specific command entry, for example, after several tests but before shipment.

The row and column decoders 4 and 7 can access the entire memory cell array 1 including the initial-set data area 3. However, they can not access the data area 3 by means of external addresses in regular data programming and reading operations due to no address allocation to the data area 3. A specific command entry only allows the controller 11 to control the address register 12 to generate an internal address that is required to access to the data area 3 for initially-setting data programming.

The EEPROM for which the initially-setting data has been programmed in the initial-set data area 3 as disclosed above is initialized on operation requirements by reading the programmed initially-setting data when power is on.

In FIG. 1, the EEPROM is provided with an initial-set data latch 13 for storing defective addresses, an initial-set data latch 15 for storing control data for controlling the high voltage generator 8 and a chip-data data latch 18 for storing chip data. Data are automatically read from the initial-set data area 3 and transferred to the data latches 13, 15 and 18 under control by the controller 11.

A power-on/reset circuit 17 operates when power is on. The controller 11 detects power-on and is set in a reading mode after a predetermined period for power supply stabilization and controls the address register 12 to generate an internal address which is increased for scanning the initial-set data area 3. The internal address for accessing the data area 3 is not set for a regular operation as described above.

Data in the initial-set data area 3 selected by the row and column decoders 4 and 7 are read by the sense-amplifier 5 and transferred to the data register 6 and further to the initial-set data latches 13 and 15 and the chip-data data latch 18 via a data bus BUS.

During the initially-setting operation as disclosed above, the controller 11 has generated a low-level ready/busy (R/B) signal to the outside for access inhibition.

Figure 3:
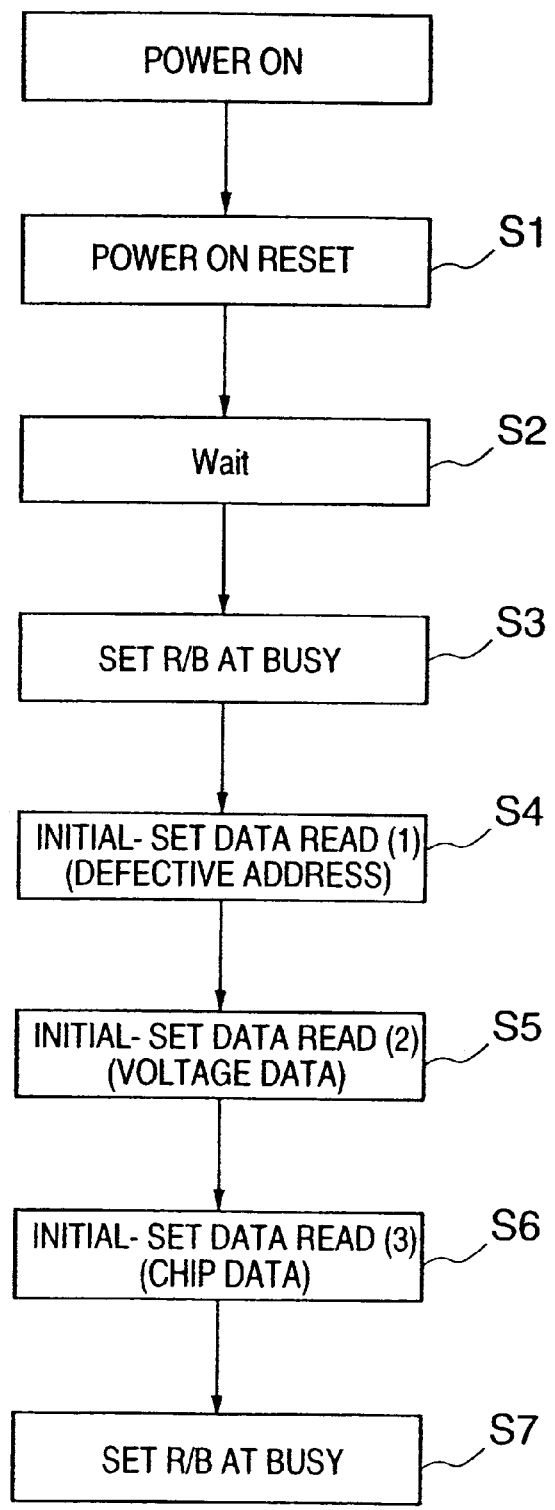
FIG. 3 shows a control flow chart for explaining initially-setting data reading according to the present invention.

FIG. 3 shows a control flow chart for explaining the initially-setting operation as disclosed above.

When power-on is detected, the power-on reset is set (STEP S1) and, after waiting for a predetermined period (STEP S2), the R/B signal is set in a busy state (STEP S3). Performed next is the initially-setting data reading operation for reading and setting defective addresses. (STEP S4). Performed subsequently is the initially-setting data reading operation for reading and setting control voltage data (STEP S5), followed by the initially-setting data reading operation for reading and setting other initially-setting data, such as, the chip data (STEP S6). The R/B signal is set in a ready (Standby) state (STEP S7) when all the initially-setting data reading operations have been completed.

The initially-setting data reading operation for reading and setting defective addresses (STEP S4) is performed to read a page that has been determined as a defective address storage area and to judge data for each column in the page.

Figure 4:
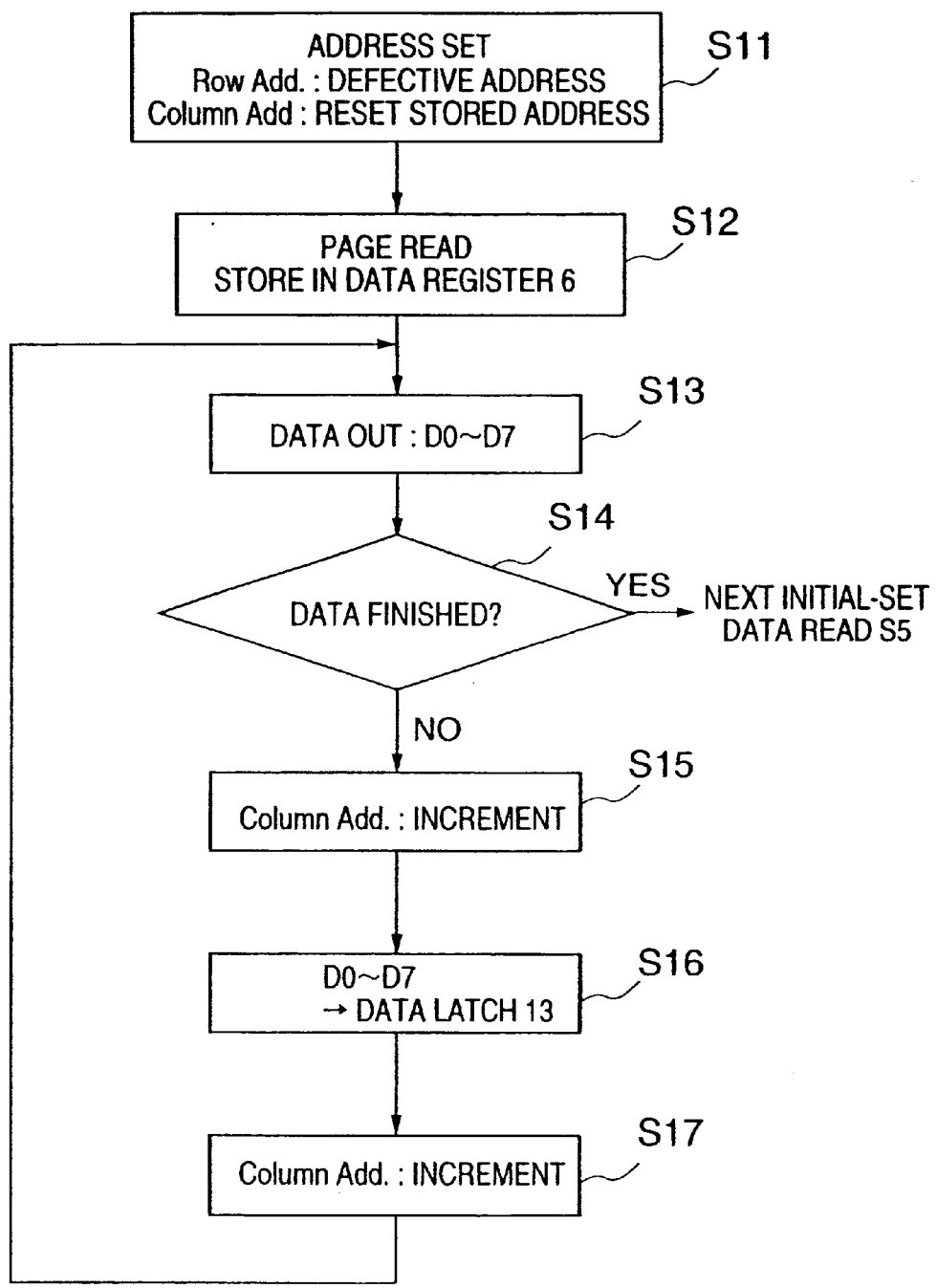
FIG. 4 shows a control flow chart of STEP S4 for the first embodiment.

In detail, as shown in FIG. 4, a row address is set in the defective address setting area in the initially-setting data whereas a column address is reset for initialization (STEP S11). The predetermined page is read and the page data are transferred to the data register 6 (STEP S12). The read one-byte data D0 to D7 among the page data stored in the data register 6 are read (STEP S13) for judging whether all the data have been finished (STEP S14).

Data for judging whether data is valid or invalid for each byte and the initially-setting data are, for example, stored in the initial-set data area 3 by turns. The judgment in STEP S14 is to judge whether the next one-byte data is valid or invalid by using the judging data. If invalid, the process goes to the next initially-setting data reading operation whereas if valid, a column address is increased (STEP S15) and the next one-byte data D0 to D7 are stored in the initial-set data latch 13 (STEP S16). The column address is further increased (STEP S17) and the process goes back to STEP S13 to repeat STEPs S13 to S17 until no valid data comes.

The same operations are applied to STEPS S5 and S6 shown in FIG. 3 in which row addresses for voltage and chip data are automatically set to perform one-page data reading, sequential one-byte data judging and storing in the data latches 15 and 18.

The initializing operation described above is automatically performed by the controller 11 when power is on. However, the initializing operation may be executed by specific command entry.

Figure 5:
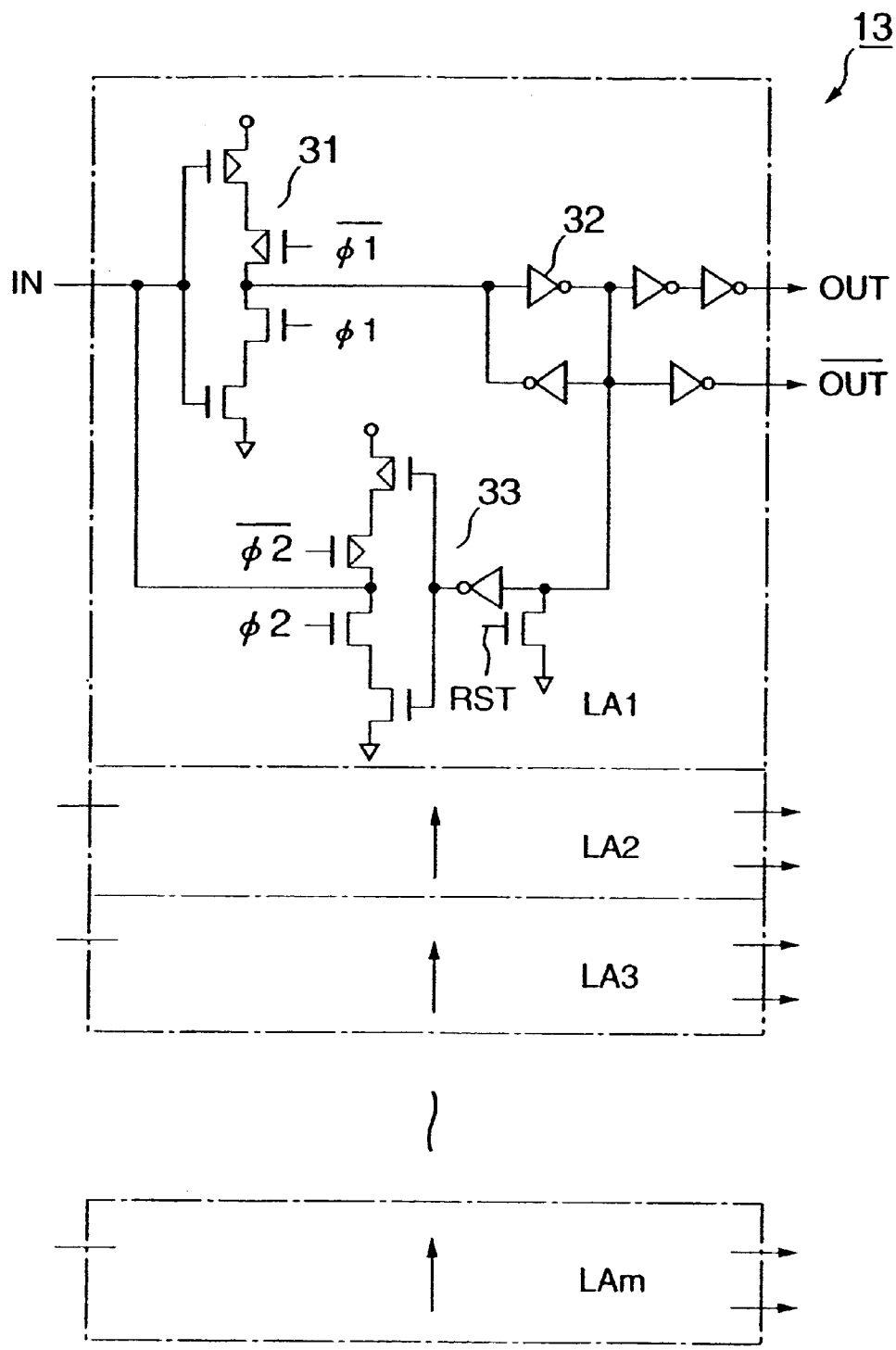
FIG. 5 is a circuit diagram of an initial-set data latch for the first embodiment.

The initial-set data latch 13 is, for example, constituted by latches LA1 to LAm, as shown in FIG. 5, the number of which is decided according to the size of the redundant row and column arrays 2a and 2b, for storing defective addresses.

Each latch LA has a latch 32, a clocked-inverter 31 for receiving data and another clocked-inverter 33 for transferring the latched data to the input-side data bus BUS.

The initial-set data latch 13 is reset when power is on or by means of a reset signal RST generated in a test mode, however, nor reset in a usual memory operation.

The same structure is applied to the initial-set data latch 15 for latching control voltage data and the chip-data data latch 18.

Once the initializing operation has been completed, the signal R/B is set in a ready state for usual data reading, programming and erasing operations. In these usual operation modes, in response to address entry, addresses stored in the address register 12 and defective addresses stored in the initial-set data latch 13 are compared by an agreement detector 14. When they agree with each other, the detector 14 generates replacement control signals "a" and "b". The control signals are sent to the row and column decoders 4 and 7 for defective cell replacement by means of the redundant row and column cell arrays 2a and 2b.

The voltage control data stored in the initial-set data latch 15 are sent to the high voltage generator 8 for voltage generation, according to data programming, erasing and reading modes.

The first embodiment is preferably provided with a test mode for checking and/or reprogramming the initially-setting data stored in the initial-set data area 3 of the memory cell array 1. The test mode is set by entering a predetermined command.

For example, on entering a predetermined command, a test mode is set for checking the initially-setting data. The controller 11 decodes the command to generate an internal address that is increased like the initializing operation already described. Initially-setting data stored at the internal address in the initial-set data area 3 is read by the sense-amplifier 5. The controller 11 controls the initially-setting data so that it is stored in the data register 6 from the sense-amplifier 5 and transferred to the outside via the I/O buffer 9.

On entering another predetermined command, another test mode is set for reprogramming the initially-setting data of the initial-set data area 3. In this mode, the controller 11 erases the entire data area 3 for reprogramming or several cell blocks thereof.

This test mode is followed by a programming mode to generate internal addresses for sequentially accessing the initial-set data area 3 like the initializing operation already described. Externally-entered initially-setting data are once stored in the data register 6 and then programmed in the initial-set data area 3 by a programming control signal sent from the controller 11.

On entering still another predetermined command, a test mode is set for reading and checking the data stored in the initial-set data latches 13 and 15 or chip-data data latch 18. Each data latch is provided with the clocked-inverter 33, as shown in FIG. 5, to transfer the latched data to the input-side data bus BUS. The controller 11 sends a clock signal ø 2 to the clocked-inverter 33 for transferring the latched data to the data bus BUS and further to the outside via the I/O buffer 9, for checking the data in the initial-set data latches 13 and 15, and the chip-data data latch 18.

Still, on entering another command, external data are programmed, via the data bus BUS, in the initial-set data latches 13 and 15, and the chip-data data latch 18 that have stored data from the initial-set data area 3 without reprogramming the area 3. This mode offers a test mode in which the initially-setting data are sequentially updated after power is on.

As disclosed above, the first embodiment provides the initial-set data area in the memory cell array, the initially-setting data being read by the usual decoders and the sense-amplifier to the memory cell array.

This circuit arrangement does not require a large chip area which would otherwise be required for storing defective addresses and the initially-setting data and also for data control, nor complex circuitry. The arrangement offers easy initially-setting data verification and updating by means of external command entry.

The Second Preferred Embodiment

Figure 6:
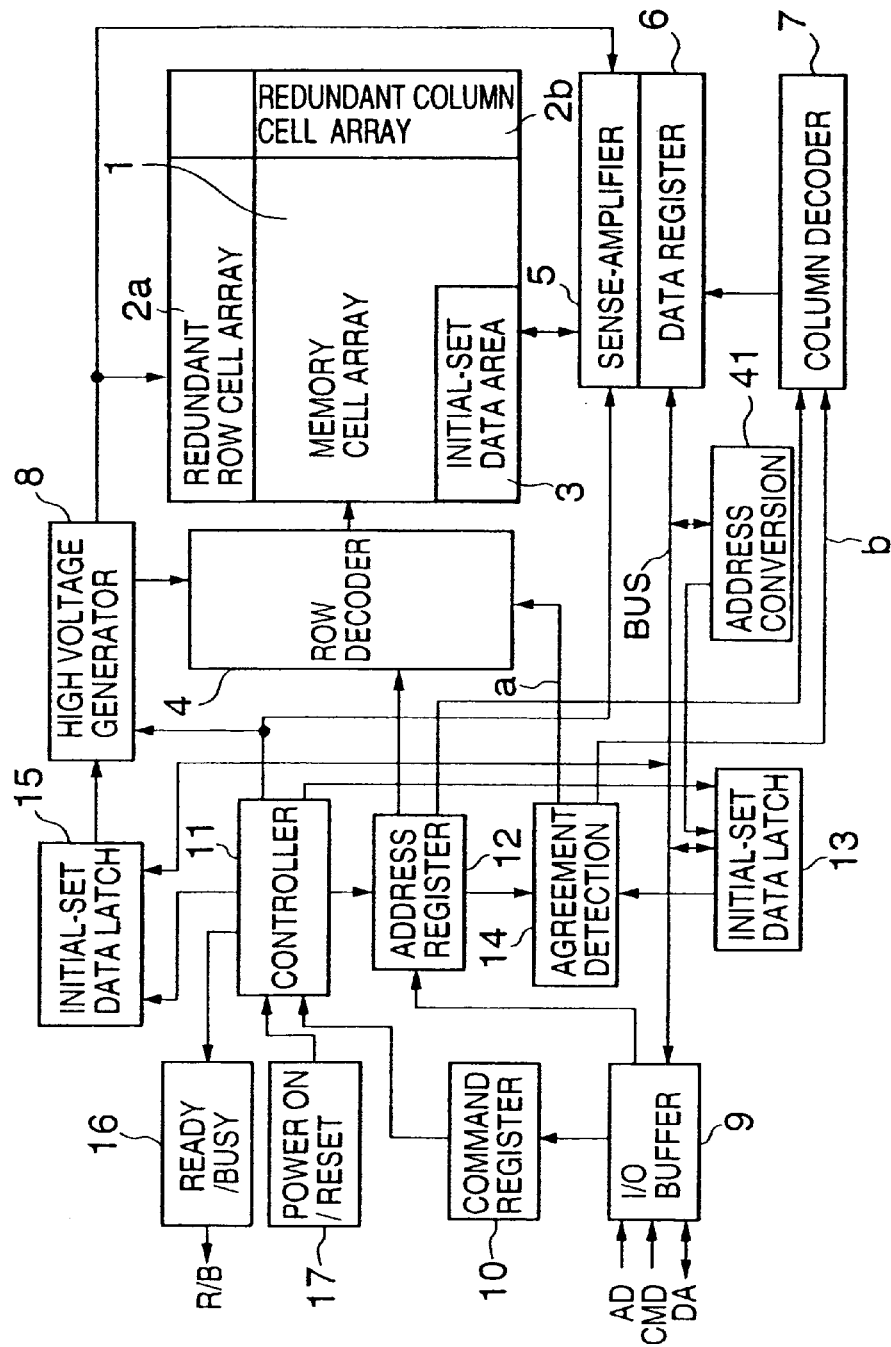
FIG. 6 is a block diagram of an EEPROM as the second preferred embodiment according to the present invention.

FIG. 6 is a block diagram of an EEPROM as the second preferred embodiment according to the present invention.

Elements in this embodiment that are the same as or analogous to elements in the first embodiment are referenced by the same reference numbers and will not be explained in detail.

The second embodiment is provided with an address converter 41 for converting address data that are read from the initial-set data area 3 and transferred to the initial-set data latch 13 in memory initializing.

The address converter 41 operates as follows: Data is usually read for one byte=8 bits from a NAND-type EEPROM. When each column address consists of 9 bits in a memory space from the addresses "0" to "511", each defective address to be stored in the initial-set data latch 13 requires 9 bits (A0 to A8).

When the NAND-type EEPROM has eight I/Os, data read out from the data register 6 at a selected one column address to the data bus BUS is one byte (8 bits). On the other hand, when there is a memory space from addresses 0 to 511 for 9-bit column addresses, defective column address reading operations are performed twice in initializing operation. The twice-read address data are combined by the address converter 41 as a 9-bit defective address data (A0 to A8) that is then stored in the initial-set data latch 13.

Concerning row addresses, for example, a 256-Mbit NAND-type EEPROM is provided with 16-bit row addresses, which also requires twice defective row address reading from the initial-set data area 3. The twice-read defective addresses are combined by the address converter 41 as a 16-bit defective address data, that is stored in the initial-set data latch 13. NAND-type EEPROMs of more than 256 M bits perform such reading operations for three times.

Such data combination is not required for the initial-set data latch 15 for control voltage setting and the chip-data data latch 18 because they require just one-byte data.

A control flow for the initial setting operation in the second embodiment is basically the same as for the first embodiment shown in FIG. 3.

Figure 7:
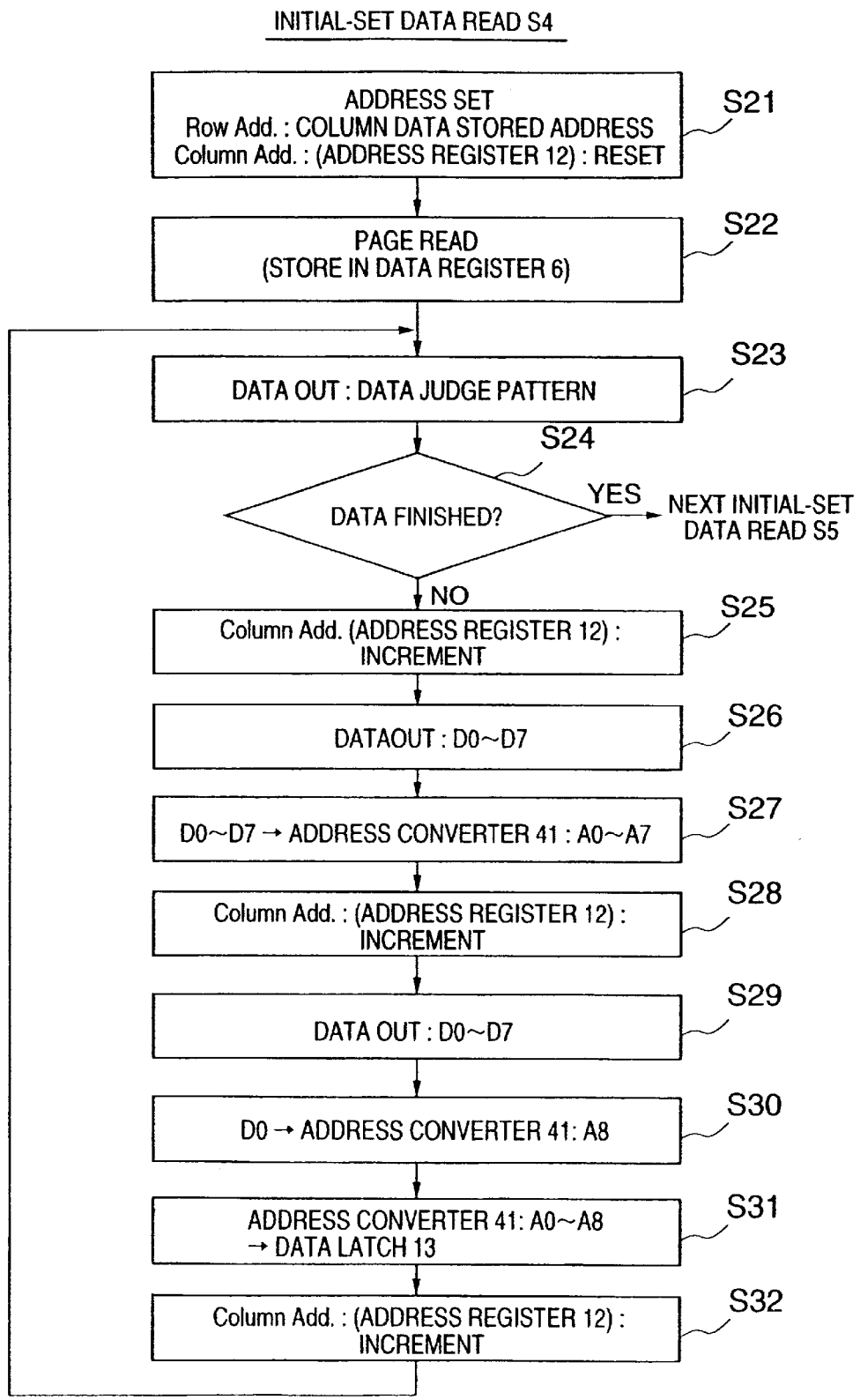
FIG. 7 shows a control flow chart of STEP S4 for the second embodiment.

The initially-setting data reading operation for reading and setting defective addresses (STEP S4) for the second embodiment is shown in FIG. 7.

In FIG. 7, the following processes are the same as those shown in FIG. 4: An address is set (STEP S21) for page reading (STEP S22), and one column page data is read (STEP S23) followed by data-completion judgment (STEP S24).

If data are not completed, in FIG. 7, a column address in the address register 12 is increased (STEP S25) for reading data D0 to D7 for one-byte data and converting than into address data A0 to A7 by the address converter 41 (STEP S27).

The column address is increased again (STEP S28) for reading the next data D0 to D7 for one-byte data and converting them into address data A8 by the address converter 41 (STEP S30).

The converted address data A0 to A8 are transferred to the initial-set data latch 13 (STEP S31), followed by increasing the column address (STEP S31) with repeating the same processes.

As disclosed, data is read for each one byte (A0 to A7) to form 9-bit address data (A0 to A8) by data combination, that is then transferred to the initial-set data latch 13.

The Third Preferred Embodiment

Figure 8:
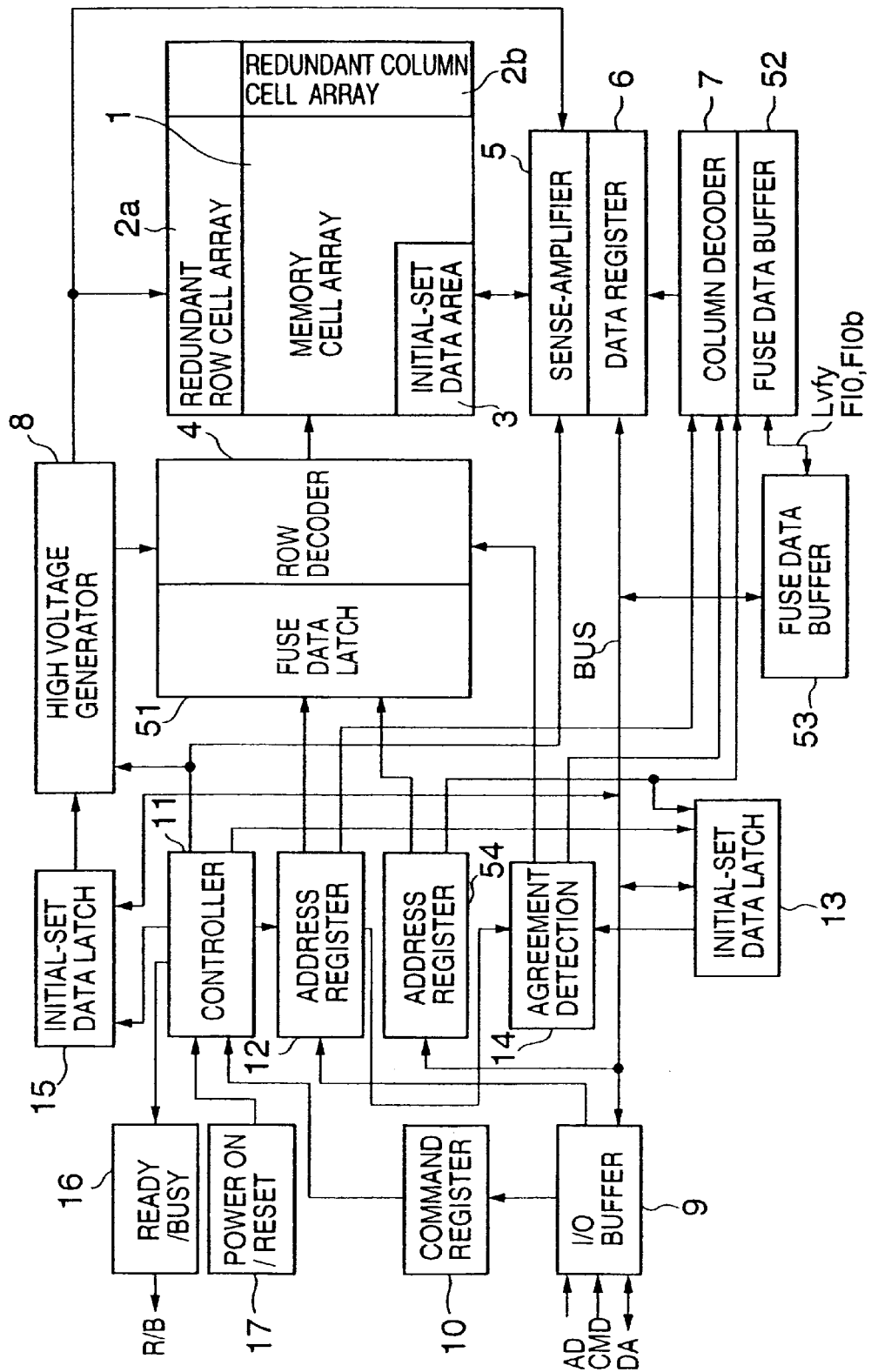
FIG. 8 is a block diagram of an EEPROM as the third preferred embodiment according to the present invention.

FIG. 8 is a block diagram of an EEPROM as the third preferred embodiment according to the present invention.

Elements in this embodiment that are the same as or analogous to elements in the first embodiment are referenced by the same reference numbers and will not be explained in detail.

The third embodiment is provided with fuse data latches 51 and 52 as subsidiary circuitry to the row and column decoders 4 and 7, respectively.

For NAND-type EEPROMs, programmed data for, usually, one page (one word line) are read by the data register 6 in serial from the I/O buffer 9 for storing one page data at once. In a verification operation, nodes of sense-amplifiers for one page are wired-ORed to detect completion of data programming. Wired-OR connection including a node of a sense-amplifier connected to a defective bit line obstructs detection of data programming completion.

Figure 9:
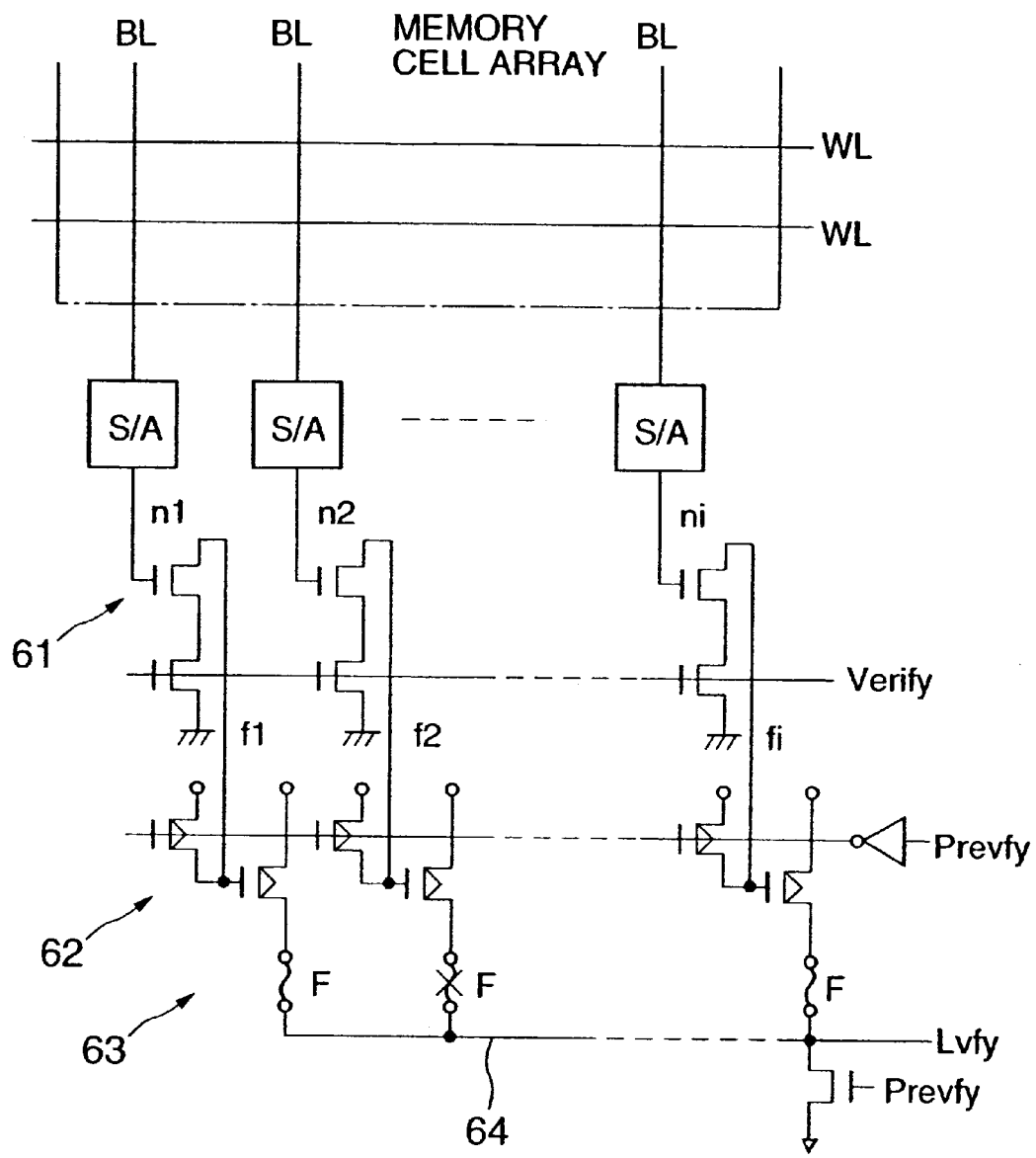
FIG. 9 is a circuit diagram of a fuse circuit for data verifying.

Such obstruction is avoided by wired-OR connection of all the nodes of sense-amplifiers via fuses in which a fuse for a defective column will be blown, as shown in FIG. 9.

In FIG. 9, connected to each of nodes n1, n2, . . . , of sense-amplifiers S/A is an open-drain-structured first detector 61 that is activated by a signal Verify. Connected to each detector 61 is a second detector 62 having PMOS transistors, the gate of one of which receives a current from the detector 61 when its output varies. The output terminal of each detector 62 is connected to a detection signal line 64 via a fuse circuit 63 having a fuse F.

An operation of the circuit shown in FIG. 9 is explained with reference to a timing chart shown in FIG. 10.

A verification operation is performed by a period t1 to decide nodes of the sense-amplifiers S/A. Before the period t1, a signal Prevfy and a signal Verify have been at high and low levels, respectively, and the detectors 61 and 62 have been kept inactive.

The signal Prevfy is brought into a low level at a period t1 so the detectors 62 are set in a floating state via an NMOS transistor, the gate of which has been charged by the high-level signal Prevfy.

Subsequently, the signal Verify is tuned into a high level at a period t2 to activate the detectors 61.

When all the nodes n1, n2, . . . , of the sense-amplifiers S/A are at a low level, signals f1, f2, . . . , input to the detectors 62 are kept at a high level, to output a low-level signal Lvfy to the signal detection line 64.

Figure 10:
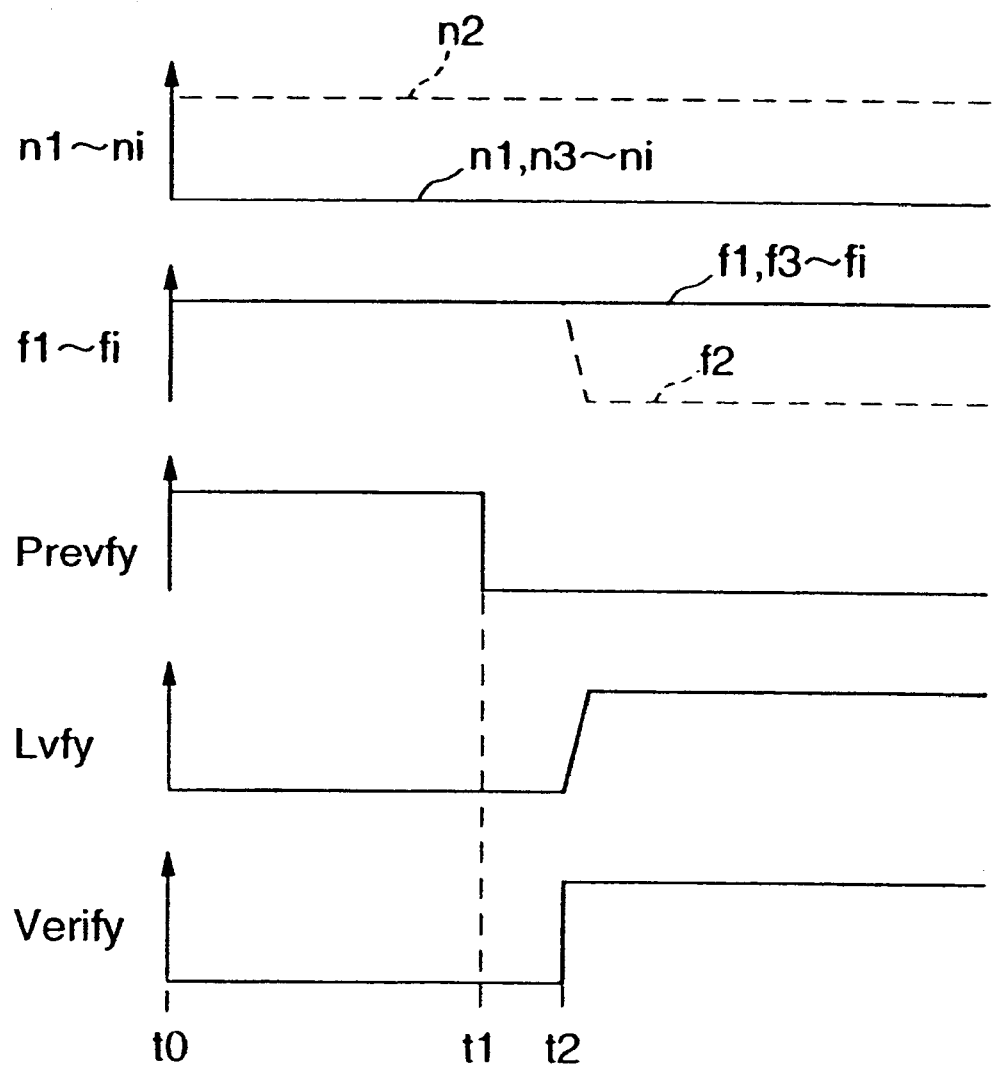
FIG. 10 shows a timing chart for the fuse circuit shown in FIG. 9.

As illustrated in FIG. 10, the signal Lvfy is brought into a high level even if one node of a sense-amplifier S/A is at a high level. In other words, the signal Lvfy is brought into a low level when a non-defective data programming is verified.

Suppose that the node n2 is at a high level due to a defective bit line. Completion of programming cannot be detected due to a signal Lvfy always at a high level no matter how many times programming and verification are repeated. The fuse F of the fuse circuit 63 corresponding to a defective column address is then blown for detection of data programming completion.

On row decoder side, a defective block is replaced with a redundant cell array and will never be inactive in a regular programming operation, thus causing no problems. However, a test mode to select all the rows via the row decoder 4 for data programming or erasing at once also activates a defective block, thus causing a problem such that a short-circuit in a defective block could obstruct application of a programming or an erasing voltage to normal blocks. In order to avoid such a problem, the fuse circuits shown in FIG. 9 are also provided in the row decoder side for separating a defective row.

The fuse data latches 51 and 52 shown in FIG. 8 are provided with latches instead of fuses for separating defective rows and columns.

Figure 11:
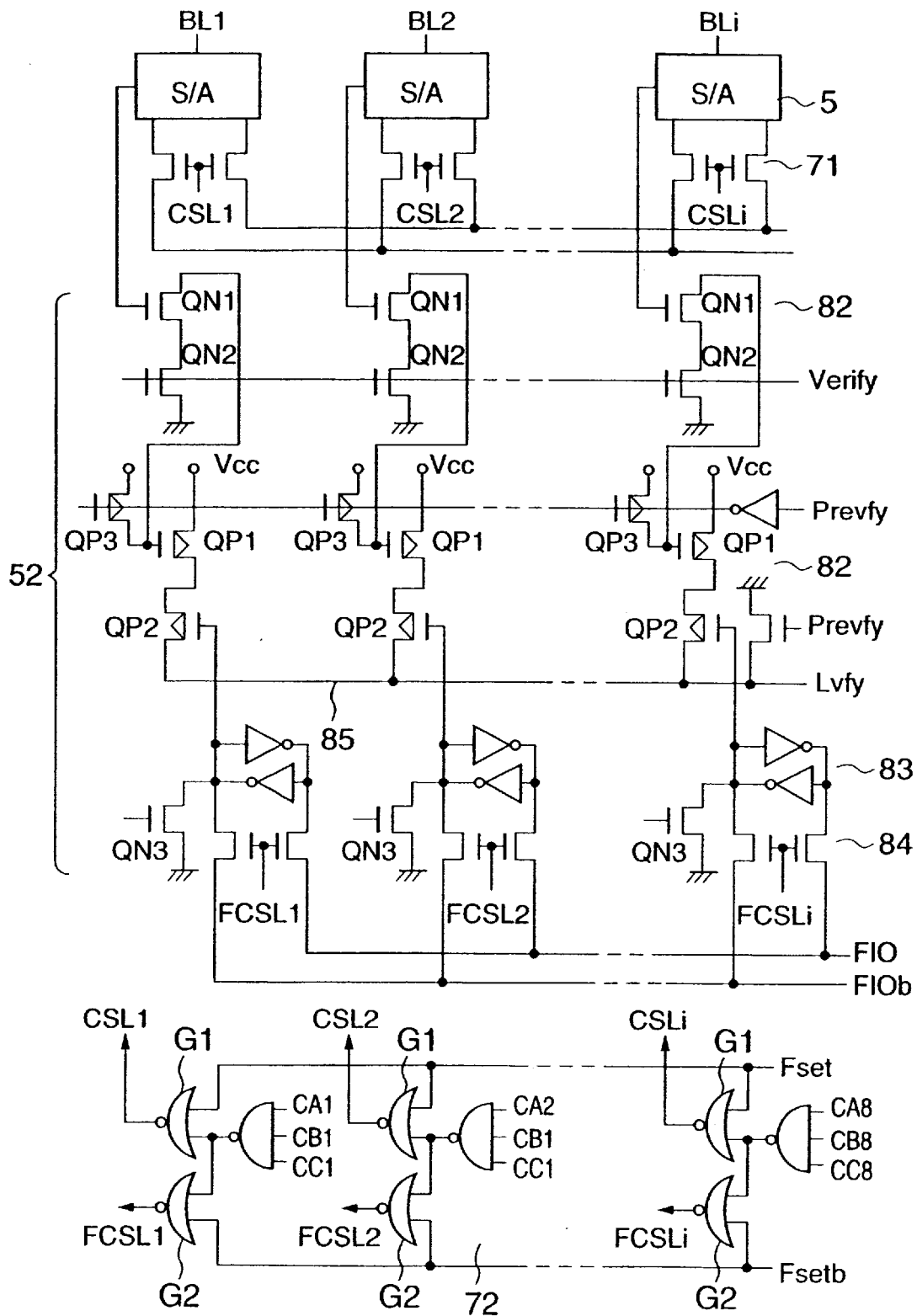
FIG. 11 is a circuit diagram of a fuse data latch shown in FIG. 8.

FIG. 11 shows the fuse data latch 52 at column side and the peripheral circuitry.

A column gate 71 and a decoder 72 shown in FIG. 11 correspond to the column decoder 7 shown in FIG. 8.

The fuse data latch 52 is provided with first detectors 81 each including an open-drain-structured NMOS transistor QN1 and an NMOS transistor QN2 for activating the transistor QN1, for wired-ORing the nodes of sense-amplifiers (S/A) 5 to a signal detection line 85 in verification of programming.

Also provided are second detectors 82 each including a PMOS transistor QP1, the gate of which is connected to the drain of the transistor QN1, and a PMOS transistor QP3 for precharging the gate of the PMOS transistor QP1. The drain of the PMOS transistor QP1 of each detector 82 is connected to the signal detection line 85 via a PMOS transistor QP2 that corresponds to the fuse F shown in FIG. 9.

Each latch 83 is used to turn off the PMOS transistor QP2 for a defective column. Supplied to the node of each latch 83 via a transfer gate 84 are output signals FIO and FIOb from a fuse data buffer 53. The data buffer 53 outputs a low-level FIO signal and a high-level FIOb signal during a memory initializing operation in which the initially-setting data are read out to be set.

Transferred to the gate of a transfer gate 84 from a column decoder 72 is a column fuse selection signal FCSL that is brought into a high level for a defective column. The column decoder 72 has NOR gates G1 that are activated in a regular operation by fuse set signals Fset and Fsetb from the controller 11 (FIG. 8) and column decode signals CA1 to CA8, CB1 to CB8 and CC1 to CC8, and also NOR gates G2 that are activated during the initializing operation.

The fuse set signals Fset and Fsetb have been at a high and a low level, respectively, during the initializing operation, to deactivate column signals CSLi so that the column gates 71 are not driven. For a defective column, a column fuse selection signal FCSL1, for example, is brought into a high level so that the corresponding latch 84 latches data for turning off the corresponding PMOS transistor QP2.

In FIG. 8, the column-side fuse data latch 52 is accessible by the controller 11 to set a fuse-set signal Fset at a high level. The data latch 52 is connected to the fuse data buffer 53 that is connected to the data bus BUS, for a test mode to check data latched in the data latch 52 by an externally-entered specific command.

Also achieved by this connection is direct fuse-data programming to the data latch 52 from the outside of the chip via the buffer 53.

The location in a memory space on which data is set to the fuse data latch 52 as disclosed above is the location corresponding to a defective column address read by the sense-amplifier 5 from the initial-set area 3 of the memory cell array 1, which requires an address register 54 as shown in FIG. 8 in addition to the address register 12. The address register 54 is also controlled by the controller 11 for storing defective addresses and data transfer to the fuse data latches 51 and 52.

Figure 12:
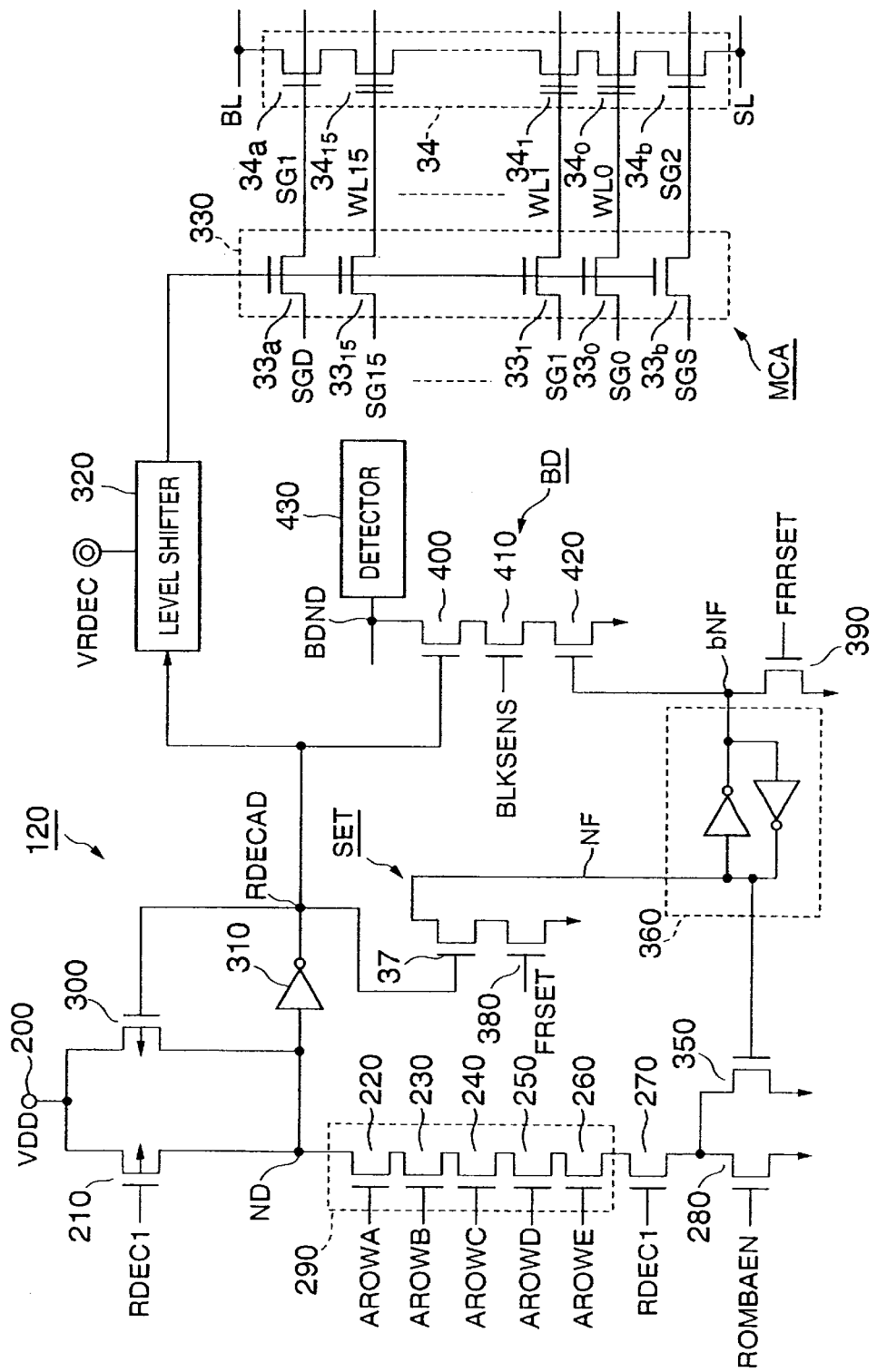
FIG. 12 is a circuit diagram of block decoders and latches included in a row decoder and a fuse data latch, respectively, shown in FIG. 8, and also the peripheral circuitry.

FIG. 12 is a circuit diagram of block decoders 120 and latches 360 included in the row decoder 4 and the fuse data latch 51, respectively, shown in FIG. 8, and also the peripheral circuitry.

The number of the block decoders 120 and latches 360 corresponds to the storage capacity of the memory cell array 1, etc., however, one circuit for them is shown for brevity.

A power supply voltage VDD is supplied to a terminal 200. Connected in series between the terminal 200 and the ground are a PMOS transistor 210 and NMOS transistors 220 to 280. A signal RDEC1 is supplied to the gates of the transistors 210 and 270 for activating the row decoder 4 (FIG. 8). Supplied to the gates of the transistors 220 to 260 are address signals, or predecoded address signals AROWA to AROWE, respectively. The transistors 220 to 260 constitute a decoder 290. Moreover, a non-selectable stare-cancellation signal ROMBAEN is supplied to the gate of the transistor 280, for canceling the state in which memory cells have been set as un-selectable.

Connected between the terminal 200 and a node ND is a PMOS transistor 300. Also connected to the node ND is the input terminal of an inverter 310 whose output terminal is connected to the gate of the transistor 300 and also the input terminal of a level shifter 320. In response to an output signal RDECAD of the inverter 310, the level shifter 320 generates a voltage higher than a power supply voltage supplied via a terminal VRDEC. The generated high voltage is supplied to the gates of transistors $33a$, $33b$, $33_0$ to $33_{15}$ that constitute a transfer gate 330.

Selection voltages SGD and SGS are supplied to transistors $33a$ and $33b$, respectively, at one terminal of the current passage of each transistor. Control voltages CG0 to CG15 are supplied to the transistors $33_0$ to $33_{15}$, respectively, at one terminal of the current passage of each transistor. These selection voltages and control voltages are set at predetermined levels by the voltage booster of the high voltage generator 8 (FIG. 8) according to operation modes of the memory cells in the memory cell array 1 (FIG. 8).

The transistors $33a$ and $33b$ are connected to selection lines SG1 and SG2, respectively, at the other terminal of the current passage of each transistor. The selection lines SG1 and SG2 are connected to the gates of selection transistors $34a$ and $34b$, respectively, the transistors and memory cells $34_0$ to $34_{15}$ constituting a NAND cell 340. The transistor $34a$ connects the NAND cell 340 to a bit line BL whereas the transistor $34b$ connects the NAND cell 340 to a source line SL.

The transistors $33_0$ to $33_{15}$ are connected to word lines WL0 to WL15, respectively, at the other terminal of the current passage of each transistor. The word lines WL0 to WL15 are connected to the control gates of the memory cells $34_0$ to $34_{15}$, respectively.

Connected in parallel to the transistor 280 is an NMOS transistor 350 for setting the block decoder 120 in a selectable or an un-selectable state. The gate of the transistor 350 is connected to the latch 360.

Connected to a node NF of the latch 360 is a setter SET having NMOS transistors 370 and 380 connected in series between the node NF and the ground, for setting the latch 360 to latch data. The gate of the transistor 370 is connected to the output terminal of the inverter 310. Supplied to the gate of the transistor 380 is a setting signal FRSET.

Connected to another node bNF of the latch 360 and the ground is an NMOS transistor 390, supplied to the gate of which is a resetting signal FRRSET. The transistor 390 is reset by the signal FRRSET.

Connected between the node bNF and the inverter 310 is a block detector BD for detecting blocks that have been set in un-selectable The block detector ED consists of NMOS transistors 400, 410 and 420 connected in series between a node BDND and the ground, and also a detector 430. An output signal RDECAD of the inverter 310 is supplied to the gate of the transistor 400. A control signal BLKSENS is supplied to the gate of the transistor 410. Connected to the gate of the transistor 420 is the node bNF of the latch 360. The node BDND is connected to other block decoders 120 (not shown) and also to the detector 430 that is provided outside the row decoder 4 (FIG. 8).

Operations of each block decoder 120 are disclosed in detail.

Block Selectable

Figure 13:
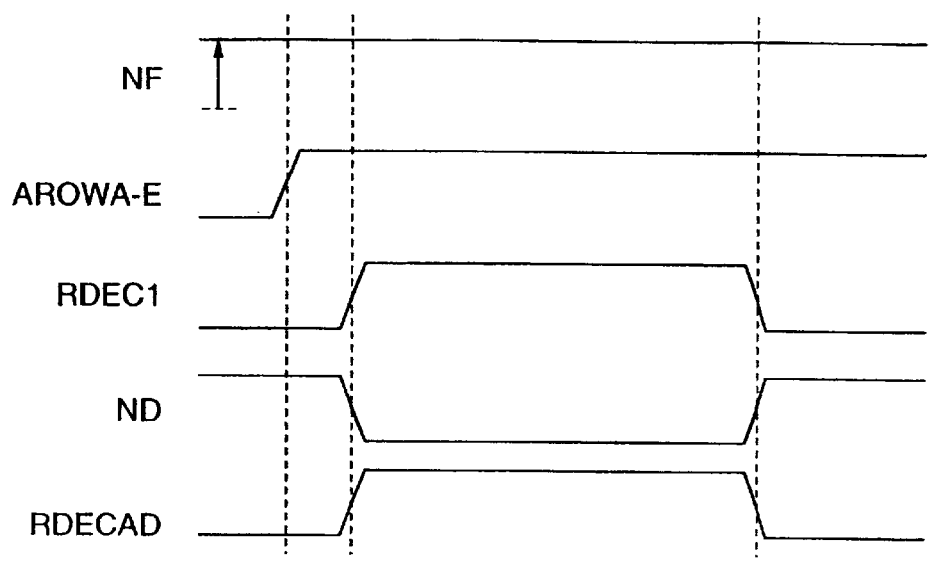
FIG. 13 shows a timing chart for the circuit shown in FIG. 12.

Disclosed first with reference to FIG. 13 is that cell blocks corresponding to a block decoder 120 are set in a selectable state. In this state, the node NF of the latch 360 is set at a high level, and the transistor 350 is turned on, thus the block decoder 120 is set in a state the same as in which a fuse is not been blown in the well-known circuitry.

The address register 12 (FIG. 8) supplies the address signals, or pre-decoded address signals AROWA to AROWE to the transistors 220 to 260 of the decoder 290. The signal RDEC1 is supplied to the gates of the transistors 210 and 270 for enabling a decoding operation after the address signal AROW has been set. A low-level signal RDEC1 precharges the node ND at a high level via the transistor 210.

The transistor 350 has been turned on because the blocks corresponding to the block decoder 120 have been set in a selectable state, so that signal RDEC1 is brought in a high level to turn off the transistor 210. High-level address signals AROWA to AROWE turn on all the transistors 220 to 260 of the decoder 290 to bring the node ND at a low level, so that the inverter 310 outputs a high-level output signal RDECAD. The level shifter 320 then supplies a voltage according to the signal RDECAD to the transfer gate 330. The voltage is supplied via the transfer gate 330 to the gates of the selection transistors 34a and 34b, and also the control gates of the memory cells $34_0$ to $34_{15}$ of the NAND gate 340.

In other words, while the node NF of the latch 360 has been set at a high-level, the signal RDECAD is brought into a high level when an input address and a block address meet each other, thus the corresponding block is set in a selectable state.

Block Un-Selectable

Figure 14:
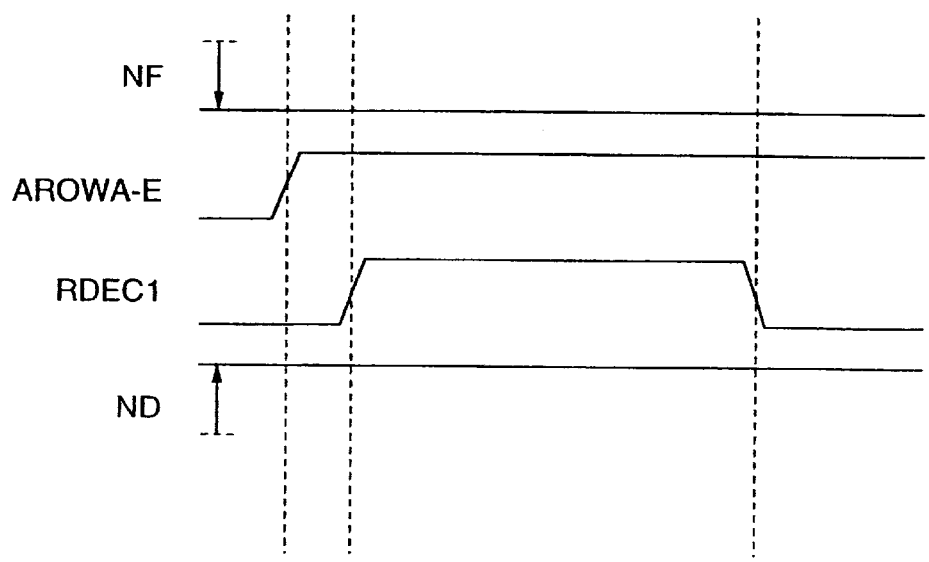
FIG. 14 shows a timing chart for the circuit shown in FIG. 12.

Disclosed next with reference to FIG. 14 is that blocks corresponding to a block decoder 120 are set in an un-selectable state. In this state, the node NF of the latch 360 is at a low level, and the transistor is turned off the same as in which a fuse is blown in the well-known circuitry.

Address signals AROWA to AROWE corresponding to a block for thin block decoder 120 and supplied to the decoder 290 turn on all the transistors 220 to 260. The node ND has, however, been set at a high level because the transistor 350 has been turned off. The output signal RDECAD of the inverter 310 is then set at a low level so that the NAND call cannot be selected via the level shifter 320 and the transfer gate 330.

In other words, a low-level node NF of the latch 360 inhibits the selection of cell blocks.

Data Set At Latch Node NF

Figure 15:
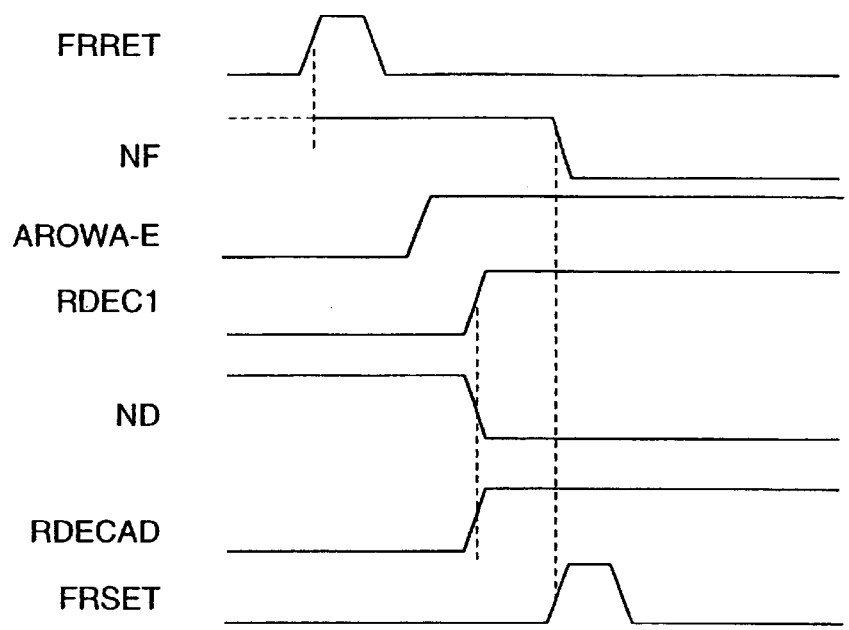
FIG. 15 shows a timing chart for the circuit shown in FIG. 12.

Disclosed next with reference to FIG. 15 is that data is set at the node NF of the latch 360.

A high-level signal FRRSET is supplied to the transistor 390, so that it is turned on to set the node NF at a high level, thus resetting the latch 360 for initializing latched data.

The nodes NF of all block decoders 120 in the row decoder 4 (FIG. 8) are set at a high level to allow all cell blocks to be selectable by the address signals AROWA to AROWE.

For setting defective blocks or blocks that have been inhibited for access on erasing or programming, in an un-selectable states address signals for blocks to be set in an un-selectable state are read from the initial-set data area 3 (FIG. 8) and supplied to the address register 54 (FIG. 8).

Each address signal is supplied from the address register 54 to the corresponding block decoder 120 to turn on all the transistors 220 to 260 of the decoder 290 included in blocks to be set in an un-selectable state and corresponding to the address signal.

A high-level signal RDEC1 is then supplied to the transistors 210 and 270 so that the former is turned off whereas the latter on. The transistor 350 is turned on because the node NF of the latch 360 has been set at a high level. The node ND of the block decoder 120 corresponding to the blocks to be set in an un-selectable state is thus brought into a low level, so that the inverter 310 outputs a high-level output signal RDECAD that turns on the transistor 370.

A high-level signal FRRSET is then supplied to the transistor 380 so that the node NF of only the latch 360 connected to the block decoder 120 corresponding to a block to be set in an un-selectable state is set at a low level to turn off the transistor 350.

Data on un-selectable block is set at the node NF of the latch 360 of a block to be set in an un-selectable state, as disclosed above. This block thus cannot be selected even though an address signal corresponding to the block is supplied to the decoder 290 in a usual operation because the transistor 350 has been turned off.

In the data setting for an un-selectable block, an address signal may be supplied to the decoder 290 according to the signal RDEC1 while the signals FRSET and ROMBAEN are set at a high level.

For a plurality of blocks to be set in an un-selectable state, repetition of operations from un-selectable block address inputting to data setting to the latch 360 achieves sequential data setting to the latch 360 of each of the block decoders 120 corresponding to the blocks to be set un-selectable.

The data setting to the latch 360 is performed for the EEPROM (FIG. 8) whenever power is on.

Data to be latched in the latch 360 may be externally input for all block-erasing or programming in test. Defective-block addresses have been stored in the initial-set data area 3 (FIG. 8) for the products to be shipped because defective blocks have to be defective on shipment.

Un-Selectable Block Detection

Addresses for blocks to be set in an un-selectable state are stored in the initial-set data area 3 (FIG. 8). A write-timing for storing such addresses is, for example, just after judgment on whether blocks that have been selected in test of erasing, programming or reading are no-defective or not. Or, such addresses data may be programmed all at once after judgment on whether all blocks are non-defective or not. This batch-address programming may require defective block detection, however, data can be programmed in a short time in the initial-set data area 3.

The batch-address programming as described above is performed by setting data on blocks to be set in an un-selectable state when selected blocks are judged as defective. In detail, data on blocks to be set in an un-selectable state are set in the latch 360 of the block decoder 120 of each defective block.

On completion of test to all blocks, defective block decoders have been set in an un-selectable state while defective block address data have not been stored in the initial-set data area 3 (FIG. 8).

This requires detection of where the defective blocks are in the memory cell array 1 (FIG. 8).

Figure 16:
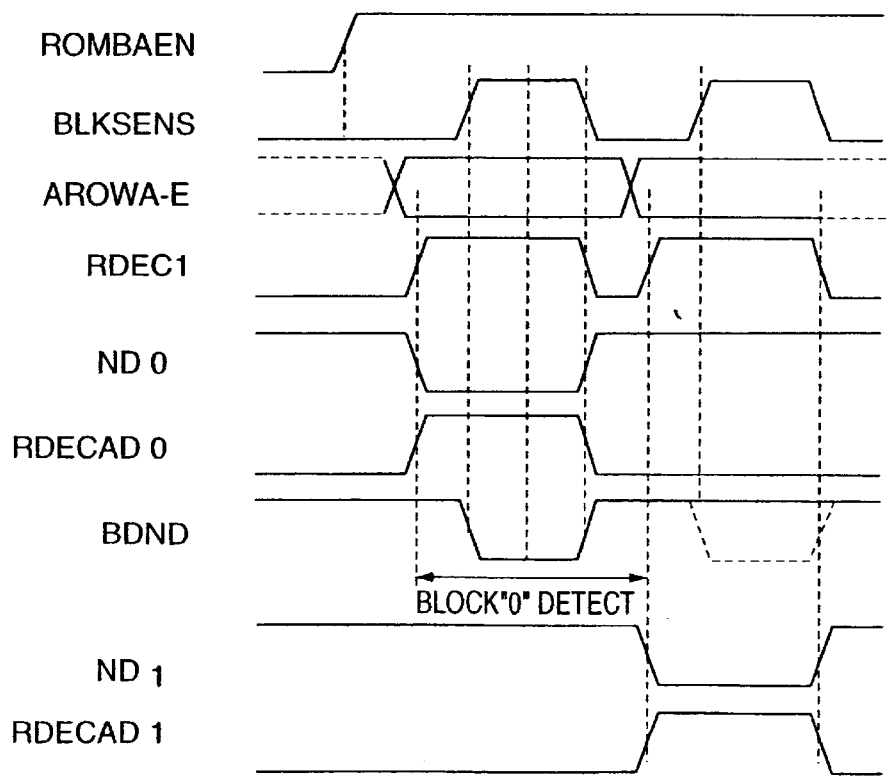
FIG. 16 shows a timing chart for the circuit shown in FIG. 12.

FIG. 16 explains a method of detecting blocks that have been set in an un-selectable state as disclosed above.

This method requires setting a block decoder 120 in a selectable state temporarily, which corresponds to a block that has been set in an un-selectable state.

For such setting, a high-level un-selectable cancellation signal ROMBAEN is supplied to the transistor 280 so that it is turned on to allow the block decoder 120 to be selectable even it the transistor 350 has been turned off.

Addresses are scanned from the head block address because it is unknown where is an un-selectable block in the memory cell array 1 (FIG. 8), and the detector 430 monitors a voltage at the node BDND of the block detector BD for detecting un-selectable blocks.

The node BDND is precharged at a high level whenever an address signal is switched. The node bNF of the latch 360 has been set at a high level while the latch 360 has been set in an un-selectable state, thus the transistor 420 has been turned on.

A control signal BLKSENS is an enable signal for block detection and brought into a high level whenever an address signal is switched, thus the transistor 410 is turned on.

In this state, when an address signal and an address of a block decoder 120 meet each other, the output signal RDECAD of the inverter 310 is brought into a high level even in an un-selectable state, thus the transistor 400 is turned on.

As disclosed, all the transistors 400, 410 and 420 are turned on when an address signal and a block that has been set in an un-selectable state meet each other, thus the node BDND is brought into a low level.

FIG. 16 illustrates that a block at a block address "0" is detected as an un-selectable block that has been set in an un-selectable state. The signal BDND has a waveform as represented by a dot line in FIG. 16 for an un-selectable block at a block address "1" as an un-selectable block. The suffixes "0" and "1" indicate signals related to the blocks "0" and "1", respectively.

When data on a selectable state has been latched in the latch 360 even though an address signal and a block address meet each other, the node bNF has been set at a low level. The transistor 420 is thus not turned on, so that the node BDND has been set at a high level.

As disclosed above, a block that has been set in an un-selectable state can be detected by the detector 430 that monitors a voltage at the node BDND while switching a block address signal.

Moreover, as disclosed, the circuitry shown in FIG. 12 has the transistor 350 connected in series to the decoder 290 to which block address signals are supplied. The transistor 350 is turned off according to data latched in the latch 360. A block corresponding to a block decoder 120 for which the transistor 350 is turned off is then set in an unselectable state. In other words, any selectable block can be set in an un-selectable state by reprogramming the latched data. This block setting can be applied, for example, to a burn-in test after packaging such that defective blocks detected in the test can be set in an un-selectable state.

The circuitry shown in FIG. 12 has no fuses like a well-known circuitry, requiring no process of blowing fuses by laser in case of defectiveness, thus improving manufacturing efficiency.

Furthermore, the circuitry shown in FIG. 12 has the block detector BD to find blocks that have been set in an un-selectable state in the memory cell array 1 (FIG. 8), thus achieving easy finding of such blocks even though a tester or a user has lost un-selectable block addresses.

Blocks can also be set in an un-selectable state by supplying un-selectable block-data from any system using the EEPROM shown in FIG. 8 to the initial-set data area 3 or the latch 360. In other words, any system using the EEPROM-chip can set any block in the memory cell array 1 in a write-protected area for which only a reading operation can be performed to specific block addresses, as already described.

Once a defective block has been replaced with a redundant block, the defective block is not accessible any more. A large number of defective blocks, however, if not possible to be replaced with redundant blocks, are accessible in an un-selectable state. The block decoder 120 corresponding to a detective block will not be activated even though the defective block address is input, thus all "0"—data is read from the defective block by a reading operation.

Any system using the EEPROM shown in FIG. 8 thus have to perform a defective-block detection if including defective blocks that have not been replaced with redundant blocks. The defective block detection is performed by reading, after erasing all blocks, of data of "1" that indicates an erased state of non-defective blocks whereas data of "0" for defective blocks, thus achieving defective block detection.

For storing block addresses programmed at which are security-data, chip ID-data, data on a particular operation etc., the corresponding blocks are set in an un-selectable state against erasing or programming whereas set at a selectable state to reading. The present invention achieves reading of un-selectable blocks by activating the transistor 280 (FIG. 12) connected to the transistor 350 in parallel, for performing any operation according to data read from these blocks.

In data setting in FIG. 8, a power-on reset signal is detected after power is on, to read data from the initial-set data area 3 according to predetermined addresses. Defective block address data that have been stored in the initial-set data area 3 are read by the sense-amplifier 5 and then stored in the data register 6. Data corresponding to a block address is read from the data register 6 by the controller 11 and transferred to the address register 54. The address register 54 then outputs an address signal to the row decoder 4 to set the latch 360 of any defective block decoder 120 (FIG. 12).

Figure 17:
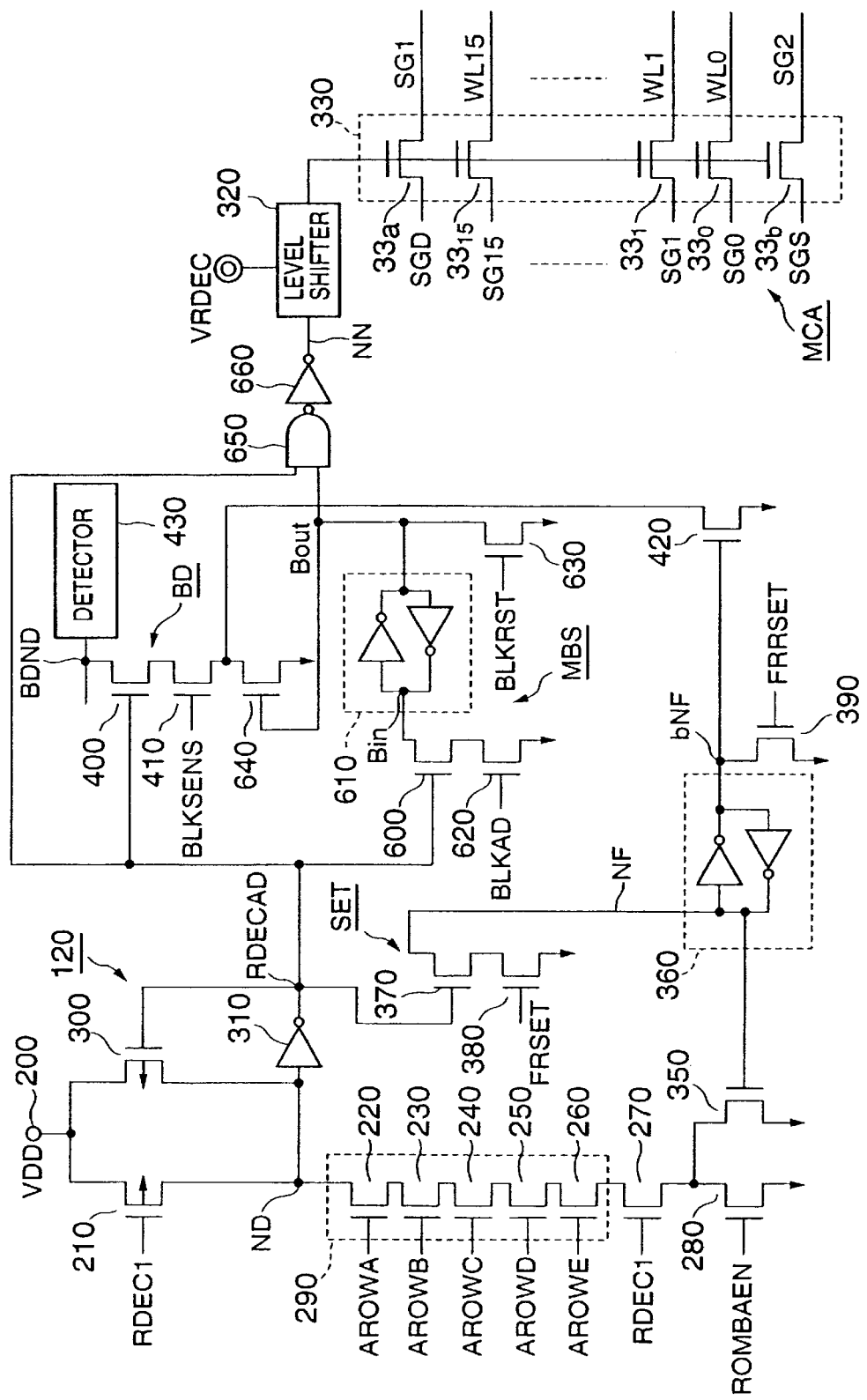
FIG. 17 is a circuit diagram of a modification to the circuit shown in FIG. 12.

FIG. 17 shows a circuit diagram of a modification to the circuitry of FIG. 12.

Elements in thin circuitry that are the same as or analogous to elements in the circuitry shown in FIG. 12 are referenced by the same reference numbers and will not be explained in detail.

This modification is applicable to a large number of non-defective memory blocks for simultaneous selectable-state setting to a plurality of blocks for erasing or programming.

In FIG. 17, connected to the output terminal of the inverter 310 is a selector MBS for simultaneous selection of a plurality of blocks. The selector MBS consists of NMOS transistors 600, 620, 630 and 640, and also a latch 610. The gate of the transistor 600 is connected to the output terminal of the inverter 310. The transistor 600 is also connected to an input node Bin of the latch 610 at one terminal of the current passage of the transistor 600, the other terminal of which is grounded via the transistor 620. Supplied to the gate of the transistor 620 is a signal BLKAD.

An output node Bout of the latch 610 is grounded via a transistor 630. A signal BLXRST is supplied to the gate of the transistor 630. The output node Bout of the latch 610 is also connected to the gate of the transistor 640 and an input terminal of a NAND gate 650, the other terminal of which is connected to the level shifter 320 via an inverter 660. The node of the transistors 410 and 420 is grounded via a transistor 640, the gate of which is connected to an output node Bout of the latch 610.

An operation of the circuitry shown in FIG. 17 is explained with reference to FIG. 18.

Figure 18:
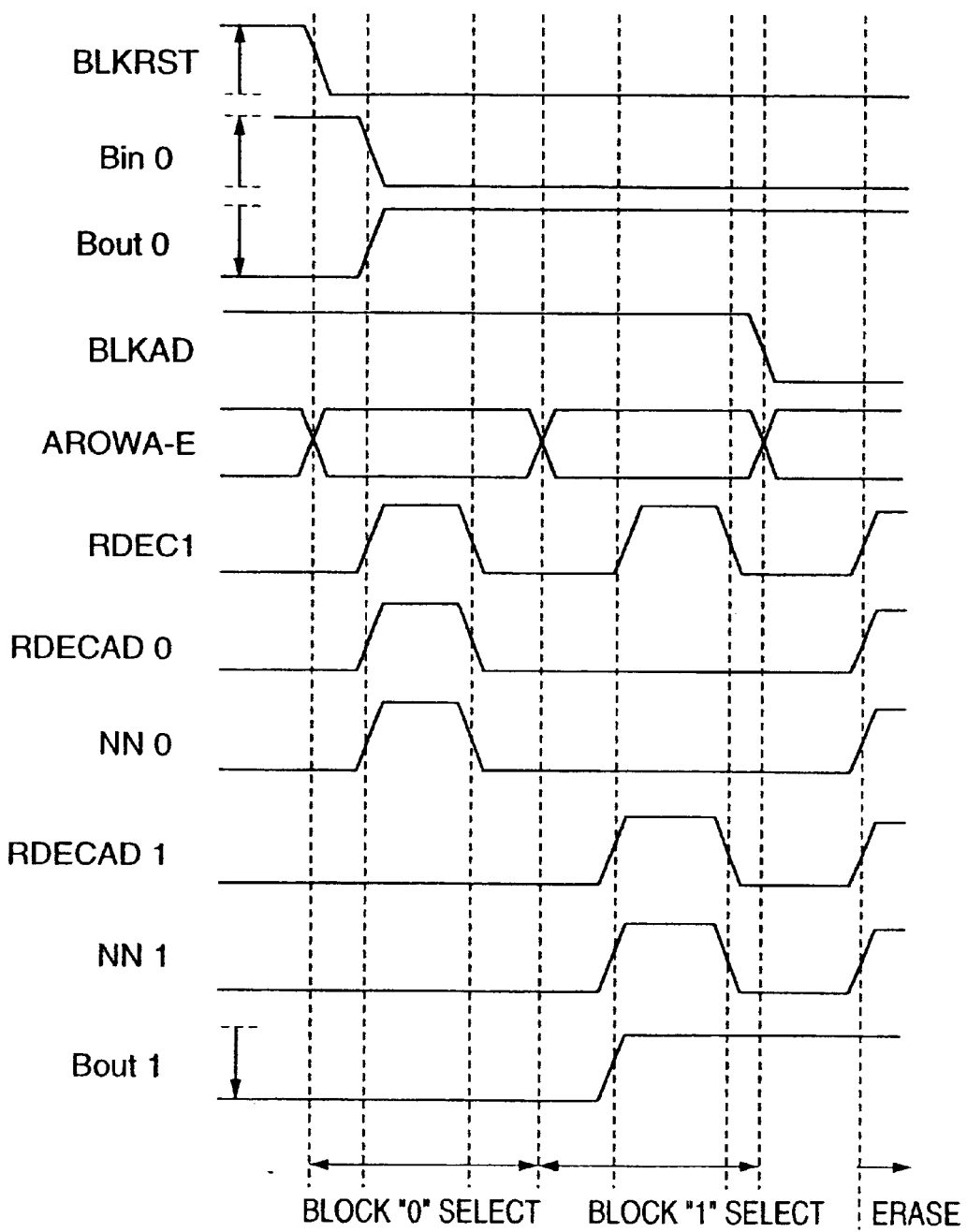
FIG. 18 shows a timing chart for the circuit shown in FIG. 17.

FIG. 18 illustrates simultaneous selection of, for instance, blocks "0" and "1". The suffixes "0" and "1" indicate signals related to the blocks "0" and "1", respectively. No suffixes are attached to signals for both blocks "0" and "1".

In the initial state, a signal BLKRST is set at a high level for resetting blocks to turn on the transistor 630, so that the input and output nodes Bin and Bout of the latch 610 are set at a high and a low level, respectively. The output signal RDECAD of the inverter 310 is set at a low level, so that an output signal of the NAND 650 is set at a high level, and then an output signal NN of the inverter 660 is at a low level. Blocks corresponding to this particular block decoder 120 have bean set in an un-selectable state.

For selection of a plurality of blocks, an enable signal BLKAD is set at a high-level to turn on the transistor 620. Address signals AROWA to AROWE are then supplied from the address register 12 (FIG. 8) to the decoder 290. When there is an agreement between the address signals AROWA to AROWE and a block address of a non-defective block, the node ND is brought into a low level, thus the inverter 310 outputting a high-level signal RDECAD (_0). The transistor 600 is then turned on, so that the input node Bin of the latch 610 is brought into a low level to output a high-level signal at the output node Bout. The address signals AROWA to AROWE are switched to repeat a decoding operation, so that output node Bout (_0, _1) of the latch 610 of each of a plurality of non-defective blocks are brought into a high level.

The signal BLKAD is brought into a low level so that all the output of the address register 12 (FIG. 8) are set in a selectable state, for erasing or programming. The signal RDECAD (_0, _1) is then brought into a high level in all the block decoders 120 except those corresponding to blocks that have been set in an un-selectable state by the latch 360. The output signal of the latch 610 is supplied to the NAND gate 650, so that an output signal NN (_0, _1) of the inverter 660 is brought into a high level only for the block decoders 120 for which the output node Bout (_0, _1) of the latch 610 has been set at a high level. The transfer gate 330 is then activated through the level shifter 320 to select a block connected to this transfer gate 330.

As disclosed, a plurality of block decoders 120 for which the output node Bout of each latch 610 is set at a high level are simultaneously selected for easing or programming.

In the modification shown in FIG. 17, a detection operation almost the same as already disclosed for un-selectable blocks is applied to detection of a plurality of selected blocks, except that the a non-selectable state-cancellation signal ROMBAEN is held at a low level for detection of selected blocks.

For selected blocks, the output signal RDECAD of the inverter 310 and the output node Bout of the latch 610 have been set at a high level. A high-level signal BLKSENS is then supplied to the transistor 410 to turn on all the transistors 400, 410 and 640, thus the node BDND is set at a low level. The potential transition at the node BDND is detected by the detector 430 to detect selected blocks.

These selected blocks are verified sequentially after the completion of erasing or programming to these blocks.

The modification also detects blocks that have been set in an un-selectable state by using data latched in the latch 360, like the circuitry shown in FIG. 12.

A control flow for the initial setting operation in the third embodiment (FIG. 8) is basically the same as for the first embodiment shown in FIG. 3.

Figure 19:
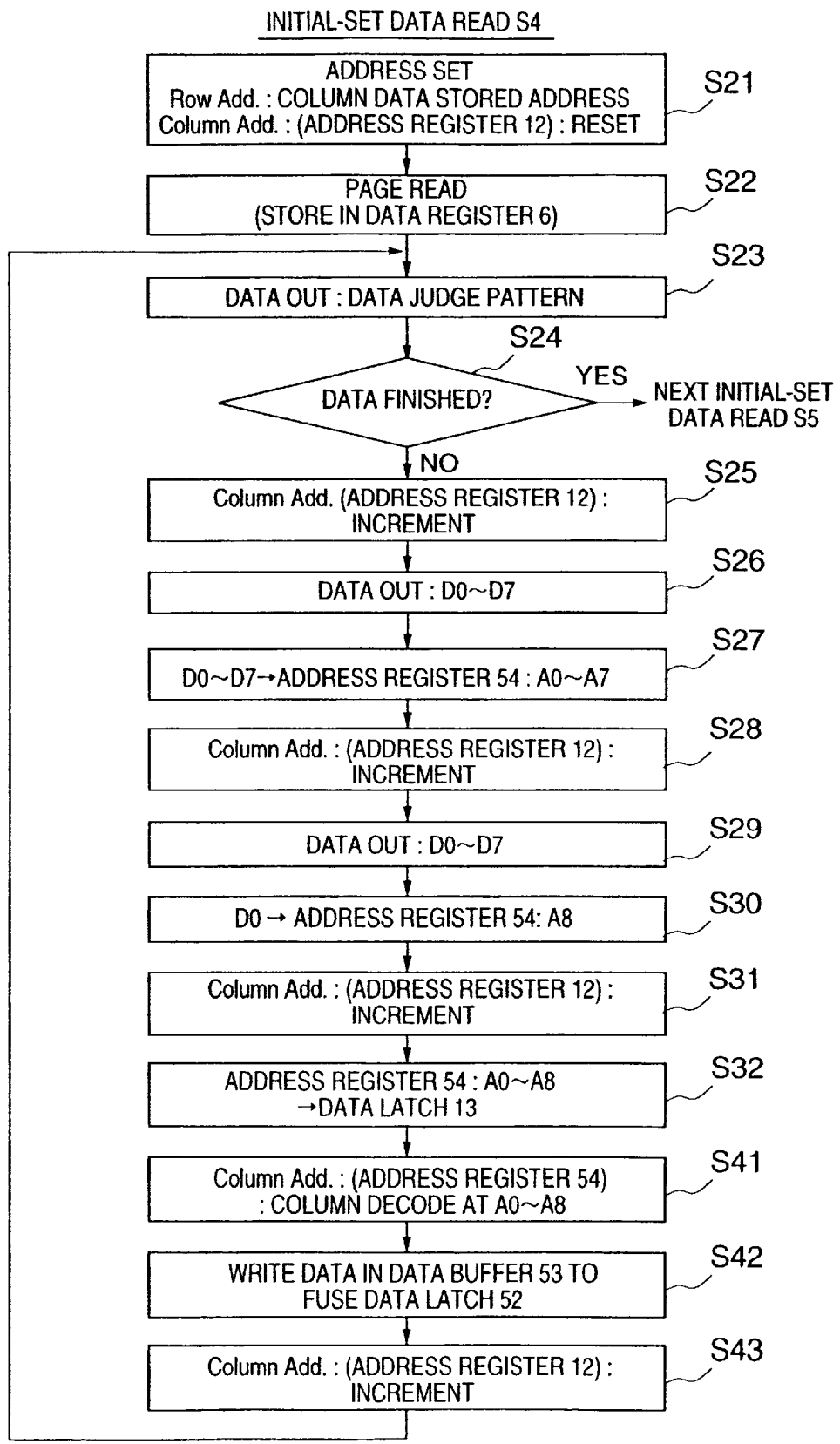
FIG. 19 shows a control flow chart of STEP S4 for the third embodiment.

FIG. 19 shown a control flow of an initially-setting data reading operation for defective column addresses in STEP S4 (FIG. 3).

STEPs S21 to S31 are the same as those shown in FIG. 7. The address converter 41 (FIG. 6) in the second embodiment corresponds to the address register 54 (FIG. 8) for column separation control in the third embodiment.

Like the second embodiment, two-column data are combined to an address data that is then stored in the data latch 13 (STEP S31), followed by defective column separation as disclosed below in third embodiment.

Column decoding is performed according to defective addresses A0 to A8 from the address register 54 (STEP S41). Data in the fuse data buffer 53 is programmed in the fuse data latch 52 (STEP S42). A column address is increased (STEP S43) for repetition of the same processes, as shown in FIG. 19.

In the foregoing embodiments shown in FIGS. 1, 6 and 8, defective address-data programming that corresponds to a defective cell for which programming or erasing to a defective address storing section in the initial-set data area 3 are neglected, disables an initial-setting operation, or transfer of the defective address data to the initial-set data latch 13.

Therefore, the defective address data is not (cannot, usually) programmed in the defective cell area in the initial-set data area 3, which has been revealed in a wafer test.

Such a case requires verification of read data whether it is valid or defective address data because defective addresses are not taken into account in the initial-setting operation to read data from the initial-set data area 3.

Disclosed next are methods of enabling defective-cell replacement with redundant cell array with defective-address storing efficient for a defective-address storing section in the initial-set data area 3.

The Fourth Embodiment

Figure 20:
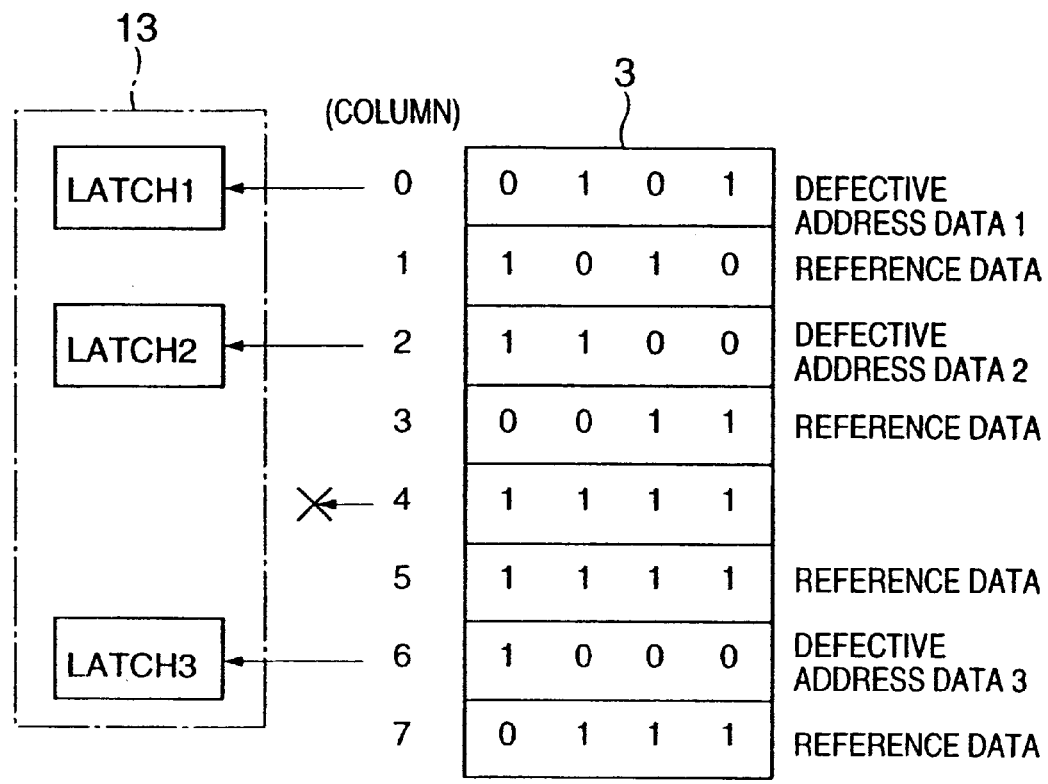
FIG. 20 illustrates a method of storing defective addresses as the fourth preferred embodiment according to the present invention.

FIG. 20 shows an embodiment of a method of storing defective addresses.

Illustrated in FIG. 20 is programming of three defective 4-bit address data 1 to 3 to each column of the initial-set data area 3.

The first defective address data 1 "0101" is programmed in the column 0. Programmed in the column 1 is "1010" as reference data, having a complementary relation with the data 1 "0101" as a data pair. Likewise, the next defective address data 2 "1100" and the complementary reference data "0011" are programmed in the columns 2 and 3, respectively.

Suppose that the column 4 in the initial-set data area 3 is defective because it can be set at "1" only. Programmed in the column 5 is "1111" as reference data, having no complementary relation with the data in the column 4.

The defective address data 3 "1000" is then programmed in the non-defective column 6, and the reference data "0111" having a complementary relation with the data 3 is programmed in the column 7.

After the defective addresses have been stored as above, the controller 11 verifies the defective addresses in the initial-set data area 3 based on the reference data and transfers the defective addresses to the initial-set data latch 13 in the initial-setting operation.

Figure 21:
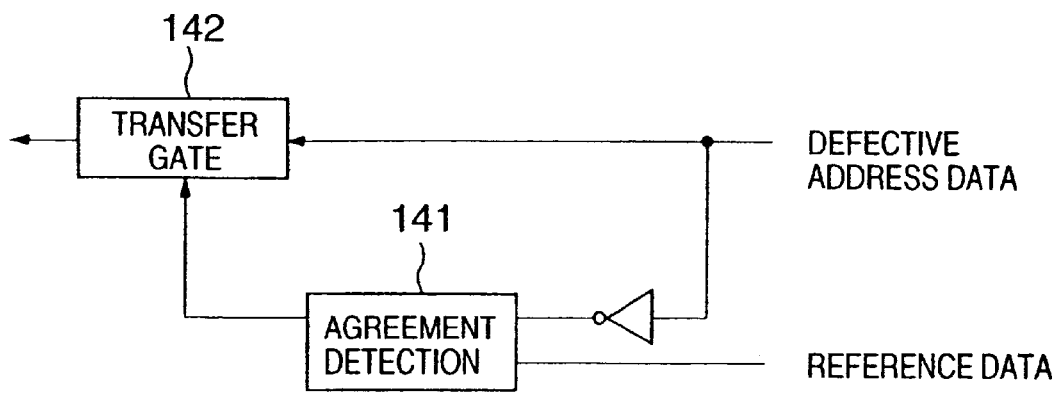
FIG. 21 is a block diagram of circuitry for defective address data verification for the fourth embodiment.

This transfer control is achieved as shown in FIG. 21.

A pair of defective address data and reference data is read from the initial-set data area 3. The defective address data is inverted and compared with the reference data by an agreement detector 141 to judge whether they meet each other. If they meet, the detector 141 turns on a transfer gate 142 to transfer the defective address data to the initial-set data latch 13.

As disclosed, accurate defective address storing and defective address data transfer to the initial-set data latch 13 are achieved even though defective cells exist in the initial-set data area 3.

The Fifth Embodiment

In the method of storing defective addresses disclosed above, defective address data and the corresponding reference data are stored in different columns.

Figure 22:
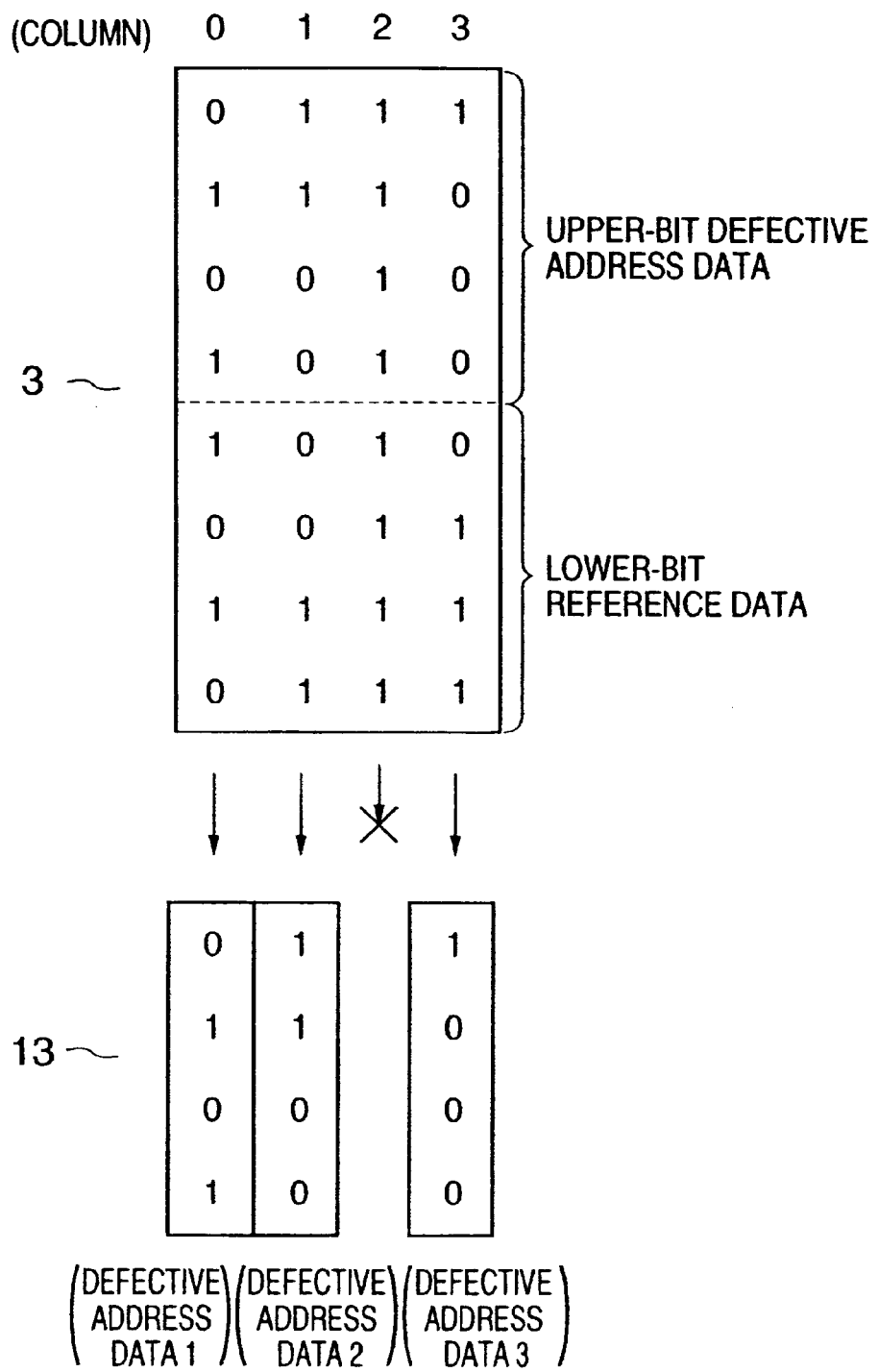
FIG. 22 illustrates a method of storing defective addresses as the fifth preferred embodiment according to the present invention.

Those data may, however, be stored in the same column, as illustrated in FIG. 22.

In FIG. 22, defective address data 1 and the corresponding reference data are stored in the upper four bits and the lower four bits, respectively, in the column 0 of the initial-set data area 3, the same to the columns 1 and 3.

Like shown in FIG. 22, suppose that the column 2 is defective and it can be set at "1" only. The lower four bits in the column 2 is also set at "1111" for the reference data.

In the initially-setting operation, like the foregoing embodiment, the controller 11 compares the upper four bits (defective address data) and the following lower four bits (reference data) read from the initial-set data area 3 for each column, thus transferring only valid defective address data to the initial-set data latch 13.

When a column address is composed of 4 bits as disclosed above, 8-bit length or more for one column data read from the column decoder 7 simultaneously offers defective address data verification only by one column data-reading operation.

The fourth and fifth embodiments employ data as reference data that has a complementary relation for each bit with defective address data, for verification of the defective address data.

This is because defective cells mostly exist in succeeding columns or rows, thus reference data having a complementary relation with defective address data, as disclosed, offers accurate and easy verification of the defective address data.

Reference data having a complementary relation other than for each bit can also be used for defective address data verification, as disclosed below.

The Sixth Embodiment

Figure 23:
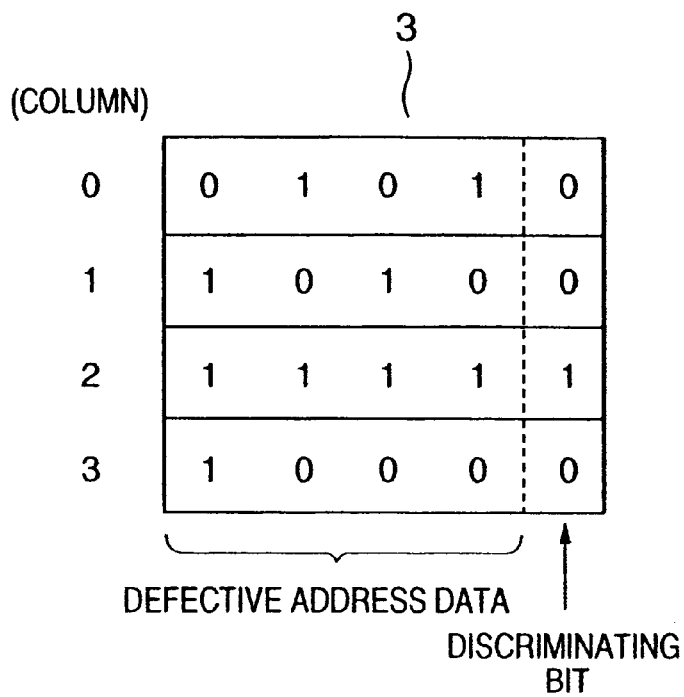
FIG. 23 illustrates a method of storing defective addresses as the sixth preferred embodiment according to the present invention.

FIG. 23 illustrates the sixth embodiment of a method of storing defective address data.

Shown in FIG. 23 is that four-bit address data is stored in the initial-set data area 3 for each column, and the column 2 can be set at "1" only, like shown in FIG. 20.

This embodiment uses a particular bit as a storage area for storing discriminating bit data for column verification. In FIG. 23, discriminating bit data "0" is stored in a particular bit of the column 2 that stores defective address data and can be set at "0" only.

Defective address data are then read out with the discriminating bit data. In FIG. 23, the detective address data in the columns 0, 2 and 3 are verified and transferred to the initial-set data latch 13.

Discriminating data of two bits or more can offer further accurate verification of defective address data.

The columns and rows in the fourth to sixth embodiments can be replaced with each other.

Defective address data to be programmed in the initial-set data area 3 is preferably data for which the difference between "0" and "1" is clearer than that for other non-defective data, which is taken in account in the following embodiment.

The Seventh Embodiment

Figure 24:
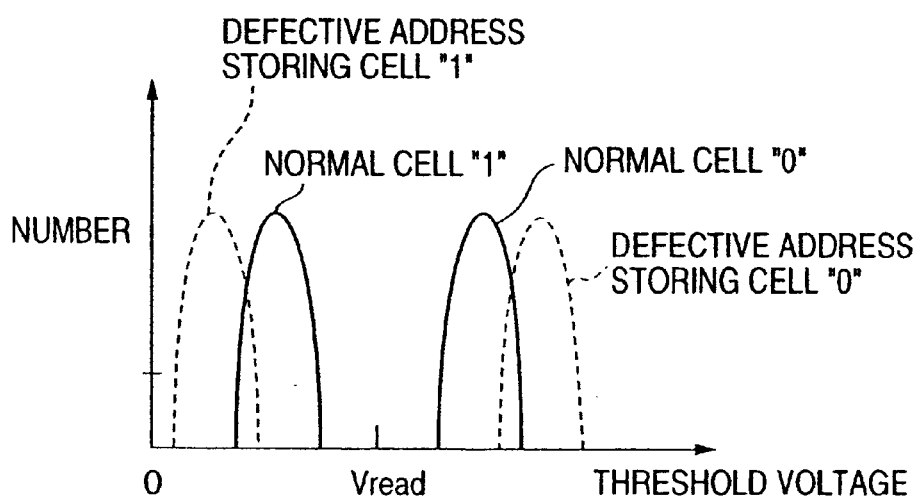
FIG. 24 represents threshold level distribution for explaining a method of storing defective addresses as the seventh preferred embodiment according to the present invention.

FIG. 24 represents threshold level distribution for memory cell data in NOR-type EEPROM.

Non-defective memory cells have a positive threshold voltage for both "1" (erased) and "0" (programmed), as indicated by a solid line, which are lower and higher, respectively, than a voltage Vread applied to a selected word line for data reading.

Defective address storing cells have data "1", as indicated by a dot line, of a threshold voltage lower than the data "1" for non-defective cells, or of an over-erased state, Defective address storing cells also have data "0", as indicated by a dot line, of a threshold voltage higher than the data "1" for non-defective cells, or of an over-programmed state.

As disclosed, the seventh embodiment also achieves an accurate defective cell replacement.

Defective address data "1" does not preferably have a negative threshold voltage, which otherwise causes obstruction of a normal operation of memory cells of a NOR-type EEPROM usually set at 0 [V] on un-selected word lines, due to a leak current generated by a defective address storing cell having a threshold voltage of an over-erased state.

The Eighth Embodiment

Figure 25A:
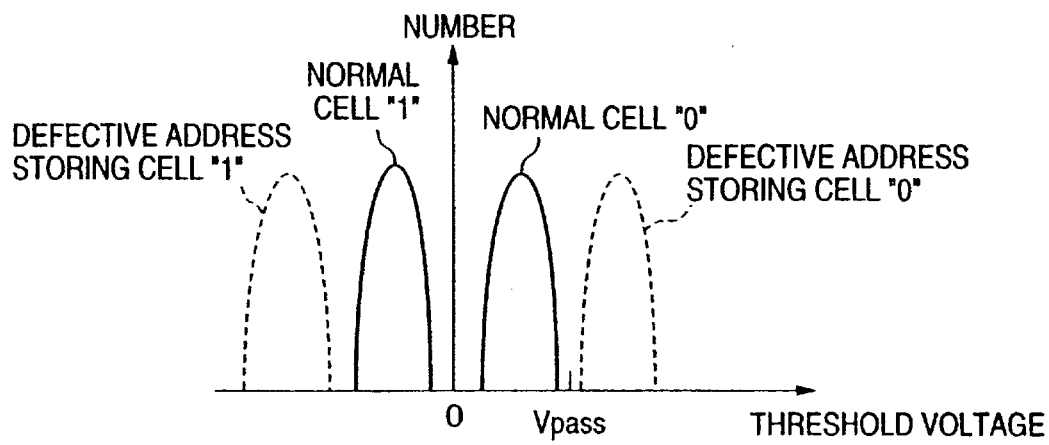
FIGS. 25A and 25B represent threshold level distribution for explaining a method of storing defective addresses as the eighth preferred embodiment according to the present invention.
Figure 25B:
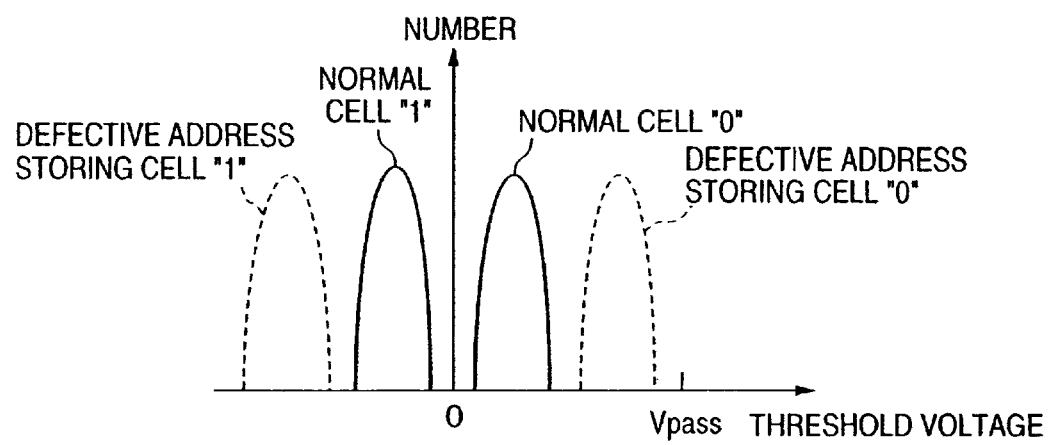

FIGS. 25A and 25B represent threshold level distribution for memory cell data in NAND-type EEPROM.

Non-defective memory cells have a negative threshold voltage for "1" (erased) and a positive threshold voltage for "0" (programmed).

A voltage of 0 [V] is applied to selected word lines whereas a pass voltage Vpass is applied to un-selected word lines in a selected NAND cell unit in data reading.

Defective address storing cells have data "1", as indicated by a dot line, of a threshold voltage lower than the data "1" for non-defective cells, or of an over-erased state.

Defective address storing cells also have data "0", as indicated by a dot line, of a threshold voltage higher than the data "0" for non-defective cells, or of an over-programmed state.

As illustrated in FIG. 25A, "0" data of a defective address-stored memory cell preferably having a threshold level higher than the pass voltage Vpass offers a highly reliable method of storing defective address data.

Programming of "0" data however can be applied only to cells located along one word line in a NAND cell unit because other word lines have to be activated by the pass voltage Vpass, thus resulting in ineffective usage of defective address storage cells.

Contrary to this, as shown in FIG. 25B, "0" data of a defective address-stored memory cell preferably having a threshold level higher than a non-defective cell but lower than the pass voltage Vpass offers a highly reliable defective cell replacement.

The seventh and eighth embodiments achieve an accurate discrimination between "0" and "1" of defective address data to be programmed in the memory cell array 1. Therefore, either way is effective between setting "0" at an over-programmed state and setting "1" at an over-erased state. The difference between threshold voltages of "0" and "1" data for defective cells is thus larger than that for non-defective cells, these embodiments also achieve highly reliable reading of defective address data.

As disclosed above, according to the present invention, an initially-setting data area is provided in a memory cell array, data of which is read by a decoder and a sense-amplifier used for usual data reading.

The present invention thus does not require a large chip area for storing defective address and other initially-setting data and their control nor complex circuitry for a remedy of defectiveness.

The present invention also offers easy initially-setting data-verification and data-updating by command entry.

Moreover, the present invention achieves a nonvolatile semiconductor memory that accurately sets defective memory blocks in an un-selectable state, which have been detected after packaging, with no lowering of manufacturing efficiency.

What is claimed is:

1. A non-volatile semiconductor memory having at least one floating gate comprising:
    a memory cell array having a plurality of electrically-rewritable non-volatile memory cells, provided with an initially-setting data area, written in which is initially-setting data for deciding memory operation requirements; a first decoder that selects memory cells in the memory cell array according to address signals; a sense-amplifier that detects and amplifies data stored in at least a memory cell selected by the first decoder;
    a latch circuit having a plurality of initially-setting data latches that latches the initially-setting data; and
    a controller that reads out the initially-setting data via the first decoder and the sense-amplifier and transfers the initially-setting data to the latch circuit.

2. The semiconductor memory according to claim 1, wherein the memory cell array includes a redundant cell array for replacing defective memory cells, the initially-setting data having data for replacing the defective memory cells with a redundant cell of the redundant cell array.

3. The semiconductor memory according to claim 1, wherein the initially-setting data includes control data for data-writing, data-erasing and data-reading operations.

4. The semiconductor memory according to claim 1, wherein the controller automatically reads out and transfers the initially-setting data after power is on.

5. The semiconductor memory according to claim 1, wherein the controller generates a busy signal until reading out and transferring of the initially-setting data is completed after power is on.

6. The semiconductor memory according to claim 1 provided with a test mode to read out the initially-setting data from the memory cell array by command entry.

7. The semiconductor memory according to claim 1 provided with a test mode to read out the initially-setting data latched in the latch circuit by command entry.

8. The semiconductor memory according to claim 1 provided with a test mode to write data to at least either the initially-setting data area of the memory cell array or the latch circuit by command entry.

9. The semiconductor memory according to claim 1, wherein detective address data and reference data for verifying the defective address data are written in the initially-setting data area of the memory cell array, defective address data that is verified by the reference data only being transferred to the latch circuit by the controller.

10. The semiconductor memory according to claim 9, wherein the reference data has a complementary relation with the defective address data for each bit.

11. The semiconductor memory according to claim 9, wherein the reference data includes discrimination bit data for indicating that a row or a column on which the defective address is stored is valid.

12. The semiconductor memory according to claim 1, wherein the defective address data to be written in the initially-setting data area of the memory cell array has date "0" and "1", a difference between threshold levels thereof being larger than that in data area of the memory cell array.

13. The semiconductor memory according to claim 1, wherein chip data is written in the initially-setting data area of the memory cell.

14. The semiconductor memory according to claim 1, wherein the memory cell array includes a plurality of blocks, each block having a plurality of word lines and the memory cells connected to the word lines, the first decoder including a plurality of block decoders arranged so as to correspond to each block, each block decoder selecting a block corresponding to an address signal,
    each block decoder having;
    a second decoder provided in each block decoder, that decodes the address signal; and
    a first switch connected in series to the second block decoder, that activates or deactivates the second decoder,
    the initially-setting data area having a memory section to store an address of a block to be set in an un-selectable state, and
    a setter provided in each block decoder, that sets the first switch in an off-state according to an address supplied by the memory section.

15. The semiconductor memory according to claim 14 further comprising a holder connected to the second decoder of each block decoder, that sets a block in a selectable state according to an output signal of the corresponding second decoder.

16. The semiconductor memory according to claim 14 further comprising:
    a second switch connected to the first switch in parallel, that is turned on when blocks that have been set in an un-selectable state are detected; and
    a detector connected between the second decoder and the setter, that detects the blocks that have been set in the un-selectable state by detecting a variation in an output signal of the second decoder while the setter has set the first switch in the off-state in detection of the blocks that have been set in the un-selectable state.

17. The semiconductor memory according to claim 14, wherein the storing section supplies address signals corresponding to the blocks that have been set in the un-selectable state to the block decoders just after power is on.

18. The semiconductor memory according to claim 1, further comprising a plurality of bit lines connected to memory cells storing the initially-setting data area and also to memory cells storing data other than the initially-setting data, the sense-amplifier detecting either data via the bit lines.

19. The semiconductor memory according to claim 1, wherein the memory cell array is a NAND-type EEPROM array.

20. A non-volatile semiconductor memory having at least one floating gate comprising:
    a memory cell array having a plurality of electrically-rewritable non-volatile memory cells and a plurality of blocks, each block having a plurality of word lines and the memory cells connected to the word lines, provided with an initially-setting data area, written in which is initially-setting data for deciding memory operation requirements;

a first decoder that selects memory cells in the memory cell array according to address signals;

a sense-amplifier that detects and amplifies data stored in at least a memory cell selected by the first decoder;

a latch circuit having a plurality of initially-setting data latches that latches the initially-setting data; and a controller that reads out the initially-setting data via the first decoder and the sense-amplifier and transfers the initially-setting data to the latch circuit.

21. The semiconductor memory according to claim 20, wherein the memory cell array includes a redundant cell array for replacing defective memory cells, the initially-setting data having data for replacing the defective memory cells with a redundant cell of the redundant cell array.

22. The semiconductor memory according to claim 20, wherein the initially-setting data includes control data for data-writing, data-erasing and data-reading operations.

23. The semiconductor memory according to claim 20, wherein the controller automatically reads out and transfers the initially-setting data after power is on.

24. The semiconductor memory according to claim 20, wherein the controller generates a busy signal until the reading out and transferring of the initially-setting data is completed after power is on.

25. The semiconductor memory according to claim 20 provided with a test mode to read out the initially-setting data from the memory cell array by command entry.

26. The semiconductor memory according to claim 20 provided with a test mode to read out the initially-setting data latched in the latch circuit by command entry.

27. The semiconductor memory according to claim 20 provided with a test mode to write data to at least either the initially-setting data area of the memory cell array or the latch circuit by command entry.

28. The semiconductor memory according to claim 20, wherein detective address data and reference data for verifying the defective address data are written in the initially-setting data area of the memory cell array, defective address data that is verified by the reference data only being transferred to the latch circuit by the controller.

29. The semiconductor memory according to claim 28, wherein the reference data has a complementary relation with the defective address data for each bit.

30. The semiconductor memory according to claim 28, wherein the reference data includes discrimination bit data for indicating that a row or a column on which the defective address is stored is valid.

31. The semiconductor memory according to claim 20, wherein the defective address data to be written in the initially-setting data area of the memory cell array has data "0" and "1", a difference between threshold levels thereof being larger than that in data area of the memory cell array.

32. The semiconductor memory according to claim 20, wherein chip data is written in the initially-setting data area of the memory cell.

33. The semiconductor memory according to claim 20, further comprising a plurality of bit lines connected to memory cells storing the initially-setting data area and also to memory cells storing data other than the initially-setting data, the sense-amplifier detecting either data via the bit lines.

34. The semiconductor memory according to claim 20, wherein the memory cell array is a NAND-type EEPROM array.

* * * * *